United States Patent
Chang et al.

(10) Patent No.: US 9,041,461 B2
(45) Date of Patent: May 26, 2015

(54) POP-FREE SINGLE-ENDED OUTPUT CLASS-D AMPLIFIER

(71) Applicant: Anpec Electronics Corporation, Hsin-Chu (TW)

(72) Inventors: Ming-Hung Chang, Hsinchu County (TW); Wen-Yen Chen, Taichung (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 117 days.

(21) Appl. No.: 13/684,166

(22) Filed: Nov. 22, 2012

(65) Prior Publication Data

US 2014/0062592 A1 Mar. 6, 2014

(30) Foreign Application Priority Data

Aug. 30, 2012 (TW) .............................. 101131529 A

(51) Int. Cl.
*H03F 3/217* (2006.01)
*H03F 1/30* (2006.01)

(52) U.S. Cl.
CPC .............. *H03F 3/2171* (2013.01); *H03F 3/217* (2013.01); *H03F 1/305* (2013.01)

(58) Field of Classification Search
CPC ..... H03F 3/217; H03F 3/2173; H03F 1/0294; H03F 3/2171; H03F 1/32; H03F 1/0205; H03F 3/211; H03F 3/24; H03F 1/0211; H03F 1/0261; H03F 1/30; H03F 2200/102; H03F 1/565; H03F 2200/336; H03F 2200/351; H03F 3/2178; H03F 2200/331

USPC ........................................ 330/10, 207 A, 251
See application file for complete search history.

(56) References Cited

U.S. PATENT DOCUMENTS

| | | | |
|---|---|---|---|
| 6,940,345 B2 | 9/2005 | Nair | |
| 7,432,760 B2 * | 10/2008 | Masuda et al. | 330/10 |
| 7,932,711 B2 | 4/2011 | Ishizuka | |
| 8,558,609 B2 * | 10/2013 | Fang et al. | 330/10 |
| 2007/0290743 A1 * | 12/2007 | Liu et al. | 330/51 |
| 2012/0013403 A1 | 1/2012 | Sahara | |

FOREIGN PATENT DOCUMENTS

TW 200935404 8/2009

* cited by examiner

*Primary Examiner* — Khanh V Nguyen
(74) *Attorney, Agent, or Firm* — Winston Hsu; Scott Margo

(57) ABSTRACT

A pop-free single-ended output class-D amplifier includes: an input signal generator for generating an input signal; a power supply for supplying input power; a reference voltage generator for generating a reference voltage; a gain-adjustable stage for generating an amplified signal according to the reference voltage and adjusting a gain of the single-ended output class-D amplifier; a pulse width modulation module for outputting a pulse width modulation signal according to the reference voltage, the amplified signal, and the input power; a low-pass filter for low-pass filtering the pulse width modulation signal to generate an output voltage; and a logic controller for generating at least one control signal to control the reference voltage generator, the gain-adjustable stage, and the pulse width modulation module according to the input power, the reference voltage, and the pulse width modulation signal.

31 Claims, 19 Drawing Sheets

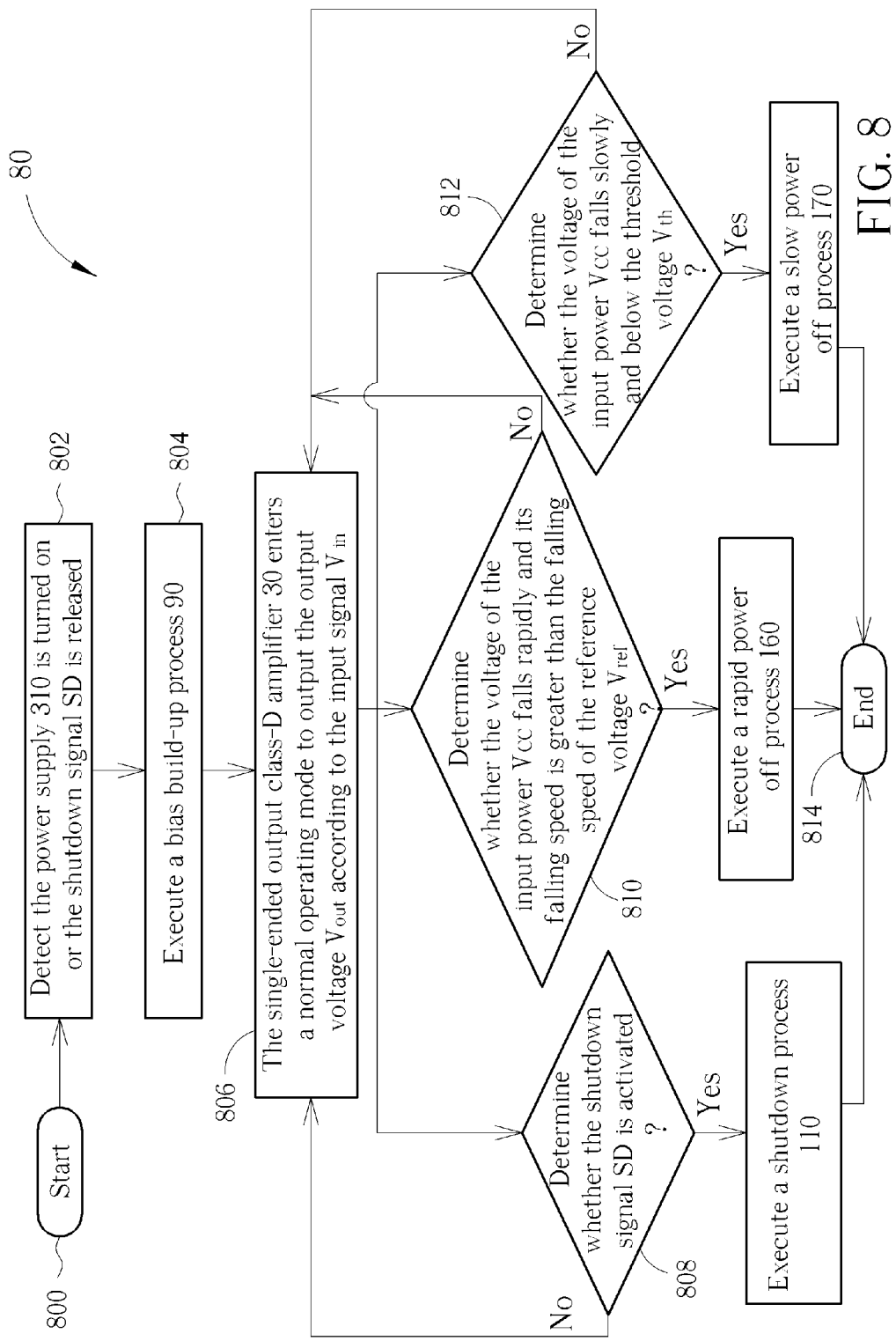

001

POP-FREE SINGLE-ENDED OUTPUT CLASS-D AMPLIFIER

BACKGROUND OF THE INVENTION

1. Field of the Invention

The present invention relates to a single-ended output class-D amplifier, and more particularly, to a pop-free single-ended output class-D amplifier capable of controlling an output voltage when a power supply is turned on/off or a shutdown signal is activated/released for preventing the output voltage from rising and falling rapidly, in order to reduce a 'popping' sound.

2. Description of the Prior Art

As technology advances, consumer electronic products have become essential items in everyday life. This huge popularization of consumer electronic products has led to their quality requirements also becoming higher; hence, products are developed to be of high quality and refinement. An acoustic device is provided here as an example (e.g. an earphone or hi-fi equipment). When listening to music or watching a movie, low quality sound or frequent 'popping' noises will significantly detract from a viewer's enjoyment. More and more portable electronic products are equipped with electric-to-audio converting devices. This can give rise to power saving and weight concerns, and therefore other issues such as low distortion, high efficiency, small size, and low cost must be considered when designing these devices.

Conventionally, an audio signal amplifier of the acoustic device can be implemented with an A-class amplifier, a B-class amplifier, or an AB-class amplifier. Amongst the three classes of amplifiers, the A-class amplifiers have the maximum static working currents and smallest distortion but have the lowest power efficiency, and thus generate a higher thermal energy. The B-class amplifiers have the minimum static working current and highest power efficiency but also the greatest distortion. The AB-class amplifiers combine the advantages of the A-class amplifiers and the B-class amplifiers. The AB-class amplifiers have static working currents which are between the A-class amplifiers and the B-class amplifiers, and the distortion and power efficiency also lie between both types of amplifiers. Therefore, most acoustic devices and electric-to-audio converting devices utilize the AB-class amplifiers as their audio signal amplifier.

In recent years, class-D amplifiers have become popular. Since the class-D amplifiers possess higher power efficiency in comparison with the A-class amplifier, the B-class amplifier, and the AB-class amplifier, heat radiators or other additional cooling equipment may not be required. This makes the class-D amplifiers suitable for high power application. Since portable products have become more popularized in recent years, the requirements for power saving and lightness have become more important, such that the D-class amplifiers, in which heat radiators are not required, have replaced the AB-class amplifiers as the mainstream for the audio signal amplifiers.

The output stage of the audio signal amplifier can be implemented with one of two types of structure: bridge-tied load (BTL) and single-ended. The implementation of the BTL type output stage is illustrated in FIG. 1A and FIG. 1B, which are schematic diagrams of an output stage 10 of an audio signal amplifier with different current directions in the conventional BTL structure. The output stage 10 includes high-side transistors 102 and 106, low-side transistors 104 and 108, inductors L1 and L2, capacitors C1 and C2, and an electric-to-audio converting device 115. The inductor L1 and the capacitor C1 construct a low-pass filter F1, and the inductor L2 and the capacitor C2 construct a low-pass filter F2. The high-side transistors 102, 106 are coupled to the inductors L1, L2 and a power supply terminal VCC, respectively, and the low-side transistors 104, 108 are coupled to the inductors L1, L2 and a ground terminal GND, respectively. As shown in FIG. 1A, a current I1 flows from the power supply terminal VCC via the high-side transistor 102, the low-pass filter F1, the electric-to-audio converting device 115, the low-pass filter F2, and the low-side transistor 108 to the ground terminal GND. At this point, if the left terminal of the electric-to-audio converting device 115 is a positive terminal and the right terminal is a negative terminal, the current I1 flows from the positive terminal to the negative terminal, such that voltage of the positive terminal is greater than voltage of the negative terminal. As shown in FIG. 1B, a current I2 flows from the power supply terminal VCC via the high-side transistor 106, the low-pass filter F2, the electric-to-audio converting device 115, the low-pass filter F1, and the low-side transistor 104 to the ground terminal GND. At this point, if the left terminal of the electric-to-audio converting device 115 is a positive terminal and the right terminal is a negative terminal, the current I2 flows from the negative terminal to the positive terminal, such that voltage of the negative terminal is greater than voltage of the positive terminal. With the currents switched between different directions, the electric-to-audio converting device 115 can generate sound.

The implementation of the single-ended output stage is illustrated in FIG. 2A and FIG. 2B, which are schematic diagrams of an output stage 20 of an audio signal amplifier with different current directions in the conventional single-ended output structure. The output stage 20 includes a high-side transistor 202, a low-side transistor 204, an inductor L1', capacitors C1' and C3, and an electric-to-audio converting device 215. The inductor L1' and the capacitor C1' construct a low-pass filter F1'. The high-side transistor 202 is coupled to the inductor L1' and a power supply terminal VCC, and the low-side transistor 204 is coupled to the inductor L1' and a ground terminal GND. As shown in FIG. 2A, a current I1' flows from the power supply terminal VCC via the high-side transistor 202, the low-pass filter F1', and the capacitor C3 to the electric-to-audio converting device 215. At this point, the current I1' flows to a positive terminal of the electric-to-audio converting device 215, such that voltage of the positive terminal of the electric-to-audio converting device 215 may rise. As shown in FIG. 2B, a current I2' flows from the ground terminal GND via the electric-to-audio converting device 215, the capacitor C3, the low-pass filter F1', and the low-side transistor 204 back to the ground terminal GND. At this point, the current I2' flows out of the positive terminal of the electric-to-audio converting device 215, such that voltage of the positive terminal of the electric-to-audio converting device 215 may fall. With the currents switched between different directions, the electric-to-audio converting device 215 can generate sound. As a result, in comparison with the output stage 10, which requires two sets of high-side transistors, low-side transistors, and low-pass filters, the output stage 20 requires only one set of high-side transistor, low-side transistor, and low-pass filter. The number of circuit elements can be saved, and circuit areas and pin numbers can also be saved, which reduces package size requirements and saves bonding wires to reduce package cost. In the output stage 10, the current drives the electric-to-audio converting device 115 via two sets of high-side transistors and low-side transistors. In comparison, in the output stage 20, the current drives the electric-to-audio converting device 215 with only one set of high-side transistor and low-side transistor. Power consumption in the transistors can be saved by half.

In comparison with the output stage 10, the structure of the output stage 20 may be more likely to generate the 'pop' sound. As shown in FIG. 1A and FIG. 1B, according to the structure of the output stage 10, both terminals of the electric-to-audio converting device 115 are coupled to similar circuit structures. When the power supply is turned on/off or other events occur to cause the output voltage to change rapidly, the voltage of both terminals of the electric-to-audio converting device 115 may change simultaneously, which will not generate a pop. In comparison, according to the structure of the output stage 20, when the output voltage changes rapidly, the voltage difference between both terminals of the electric-to-audio converting device 215 may change rapidly to generate a pop. To overcome this problem, the output stage 20 needs an additional control circuit. Fortunately, an area of the control circuit may be far less than an area of the high-side or low-side transistor in the output stage. The single-ended output structure, which needs only one set of high-side transistor, low-side transistor, and low-pass filter, is better than the BTL structure when cost is a consideration.

The conventional method for solving the pop issue is usually to utilize more resistors and capacitors in the reference voltage generator, or any method which increases the time constant to extend a bias setup time for the output voltage (e.g. extend to 1 second). When the bias of the output voltage is required to be set up in a shorter time (e.g. when the power supply is turned on/off or the shutdown signal is activated/released), the pop noise may occur, and the problem is especially severe under higher voltage. Therefore, there is a need to provide a method to reduce a pop when the bias of the output voltage is required to be set up in a shorter time (e.g. when the power supply is turned on/off or the shutdown signal is activated/released), for the single-ended output class-D amplifier.

SUMMARY OF THE INVENTION

It is therefore an objective of the present invention to provide a pop-free single-ended output class-D amplifier capable of controlling an output voltage when a power supply is turned on/off or a shutdown signal is activated/released for preventing the output voltage from rising and falling rapidly, in order to reduce a 'popping' sound.

The present invention discloses a pop-free single-ended output class-D amplifier. The pop-free single-ended output class-D amplifier includes an input signal generator for generating an input signal, a power supply for supplying input power, a reference voltage generator for generating a reference voltage, a gain-adjustable stage coupled to the reference voltage generator and the input signal generator for generating an amplified signal according to the reference voltage and adjusting a gain of the single-ended output class-D amplifier, a pulse width modulation (PWM) module coupled to the reference voltage generator, the gain-adjustable stage, and the power supply for outputting a pulse width modulation signal according to the reference voltage, the amplified signal, and the input power, a low-pass filter coupled to the pulse width modulation module for low-pass filtering the pulse width modulation signal to generate an output voltage, and a logic controller coupled to the power supply, the reference voltage generator, the gain-adjustable stage, and the pulse width modulation module for generating at least one control signal to control the reference voltage generator, the gain-adjustable stage, and the pulse width modulation module according to the input power, the reference voltage, and the pulse width modulation signal.

The present invention further discloses a controlling method for a single-ended output class-D amplifier, for reducing a pop when the single-ended output class-D amplifier detects an input power is starting to be supplied or a shutdown signal is released. The controlling method includes turning on a mute switch to control a gain of the single-ended output class-D amplifier to be zero, resetting a reference voltage and then controlling the reference voltage to rise, turning on a fast charging circuit to charge an input signal according to the reference voltage, turning off a driving circuit in a pulse width modulation (PWM) module, and turning on an inside feedback path in the pulse width modulation module to prevent a spike from being generated at an output voltage when a loop of the pulse width modulation module is unstable, so as to prevent a pop from being generated.

The present invention further discloses a controlling method for a single-ended output class-D amplifier, for reducing a pop when detecting a shutdown signal is activated. The controlling method includes turning on a mute switch to control a gain of the single-ended output class-D amplifier to be zero, and controlling a reference voltage to fall, such that an output voltage falls in a specific ratio with a falling curve of the reference voltage.

The present invention further discloses a controlling method for a single-ended output class-D amplifier, for reducing a pop when detecting a voltage of an input power is falling rapidly. The controlling method includes turning on a mute switch to control a gain of the single-ended output class-D amplifier to be zero, and controlling a reference voltage to fall, such that an output voltage falls in a specific ratio with a falling curve of the reference voltage.

The present invention further discloses a controlling method for a single-ended output class-D amplifier, for reducing a pop when detecting a voltage of an input power is falling slowly and below a predefined value. The controlling method includes controlling a reference voltage to fall to zero, and stopping controlling an output voltage to fall in a specific ratio with a falling curve of the reference voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a schematic diagram of an operation process according to an embodiment of the present invention.

DETAILED DESCRIPTION

Figure 1A:
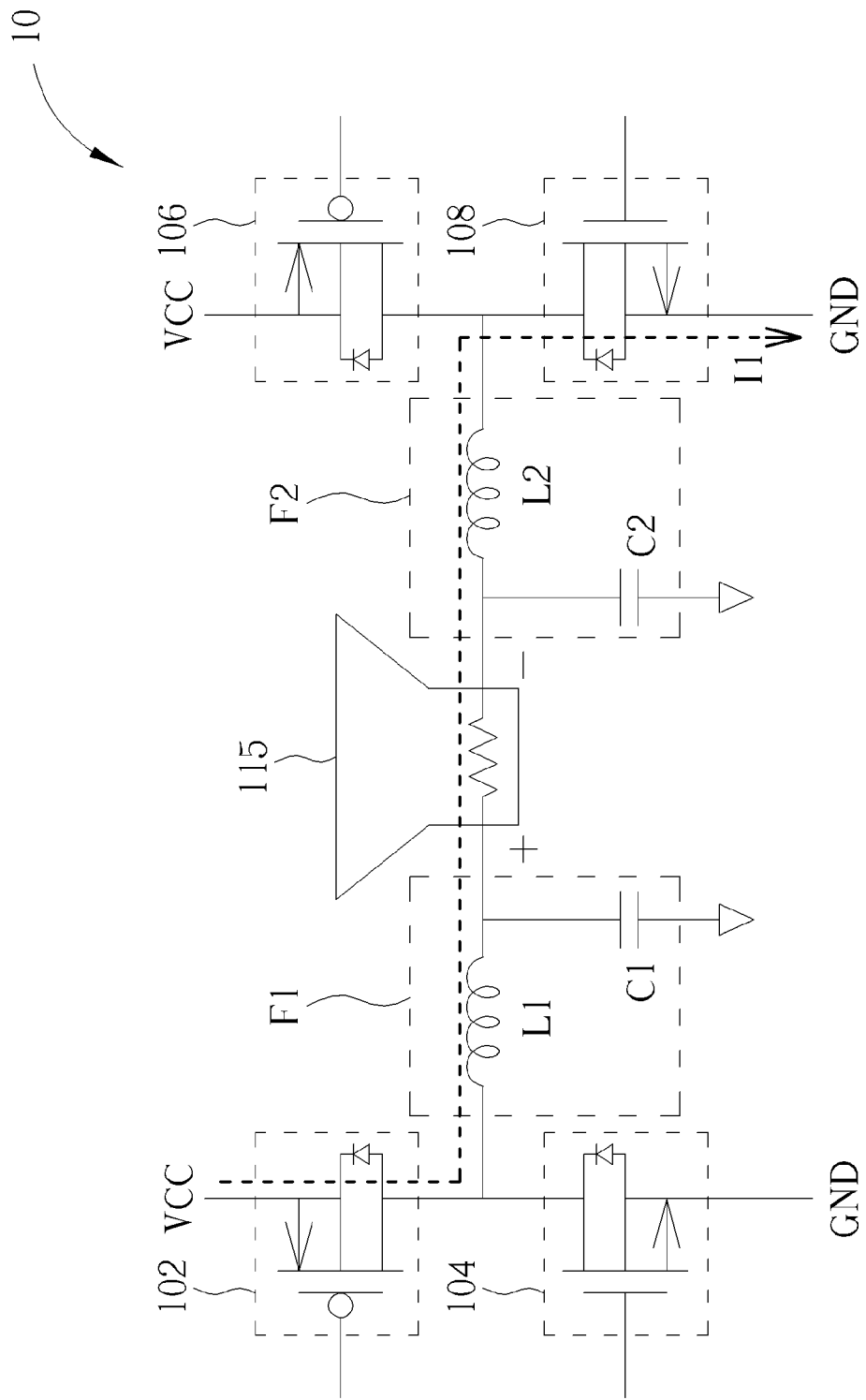
FIG. 1A and FIG. 1B are schematic diagrams of an output stage of an audio signal amplifier with different current directions in the conventional BTL structure.
Figure 1B:
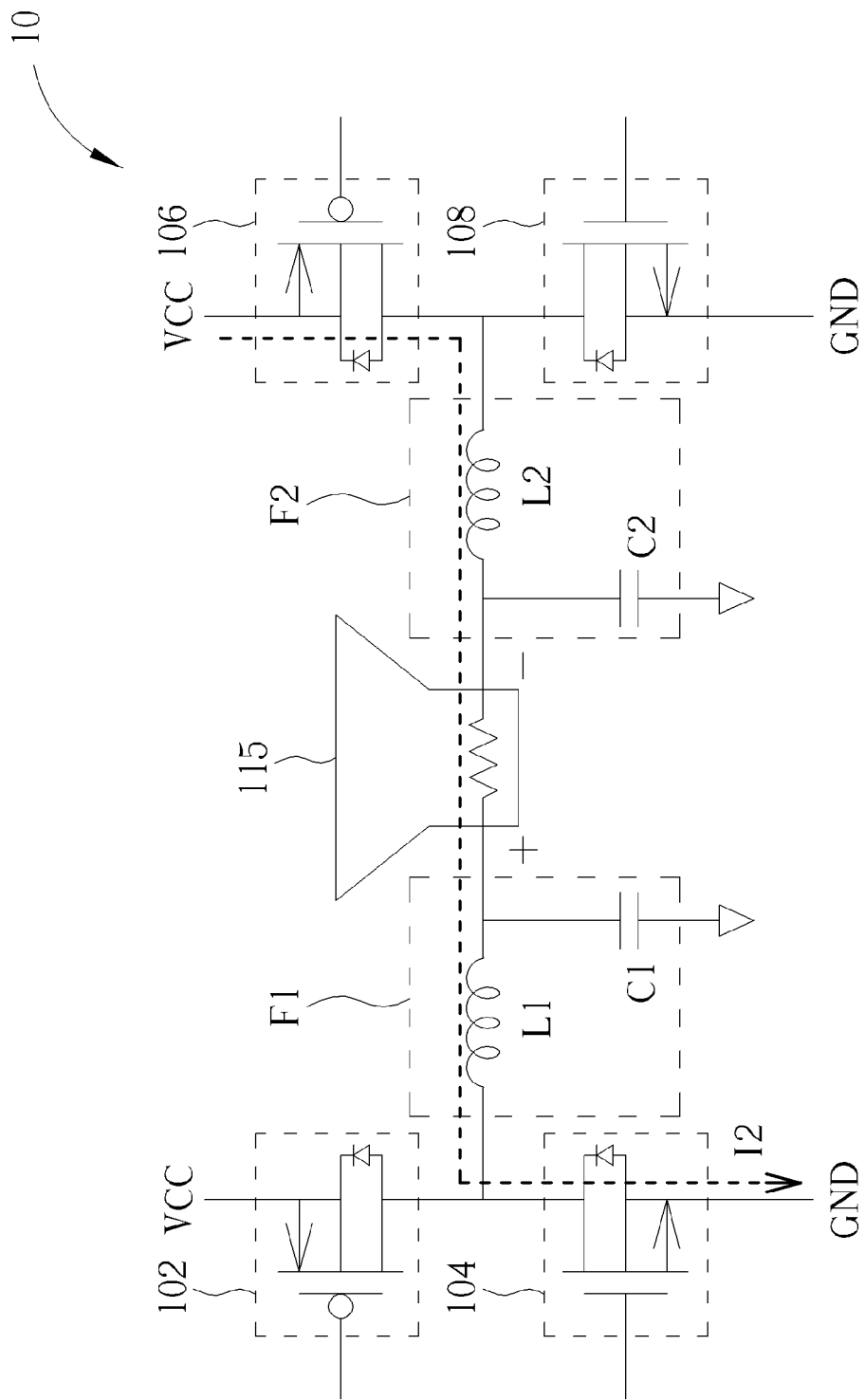
Figure 2A:
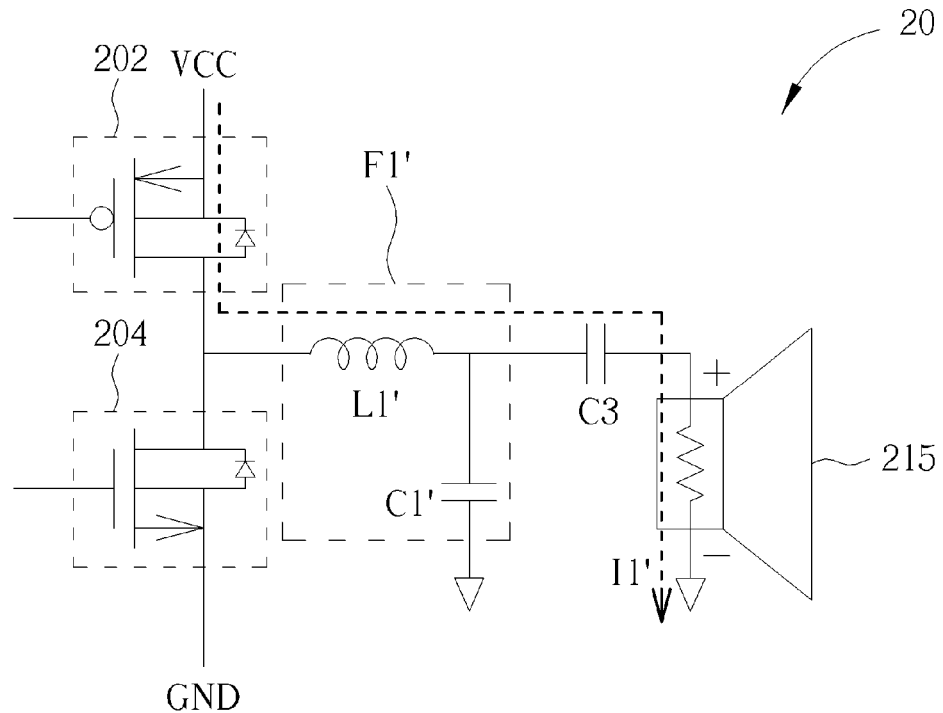
FIG. 2A and FIG. 2B are schematic diagrams of an output stage of an audio signal amplifier with different current directions in the conventional single-ended output structure.
Figure 2B:
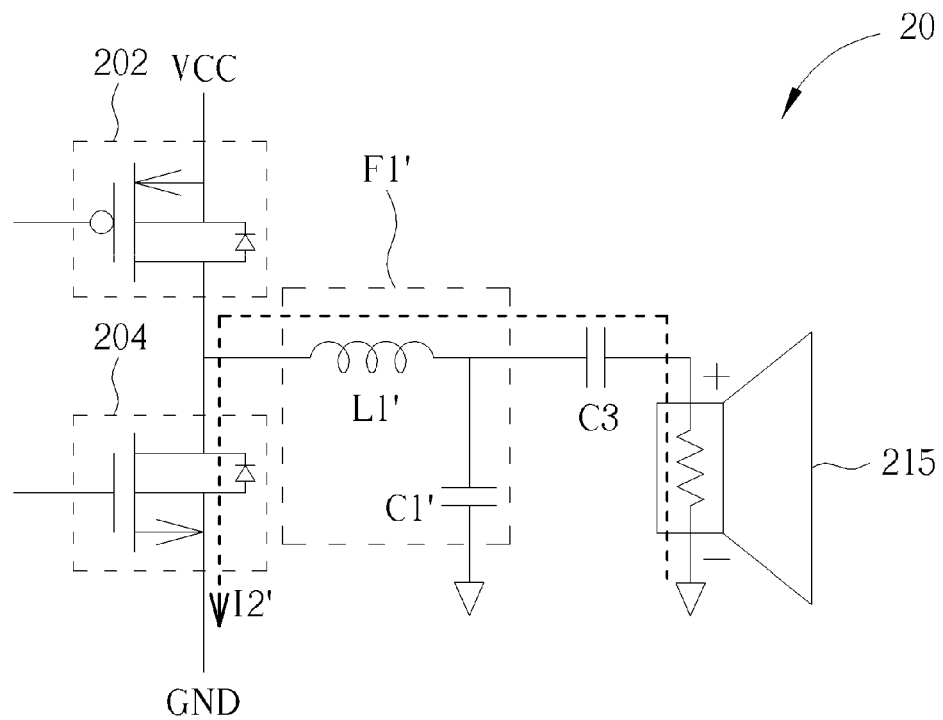
Figure 3:
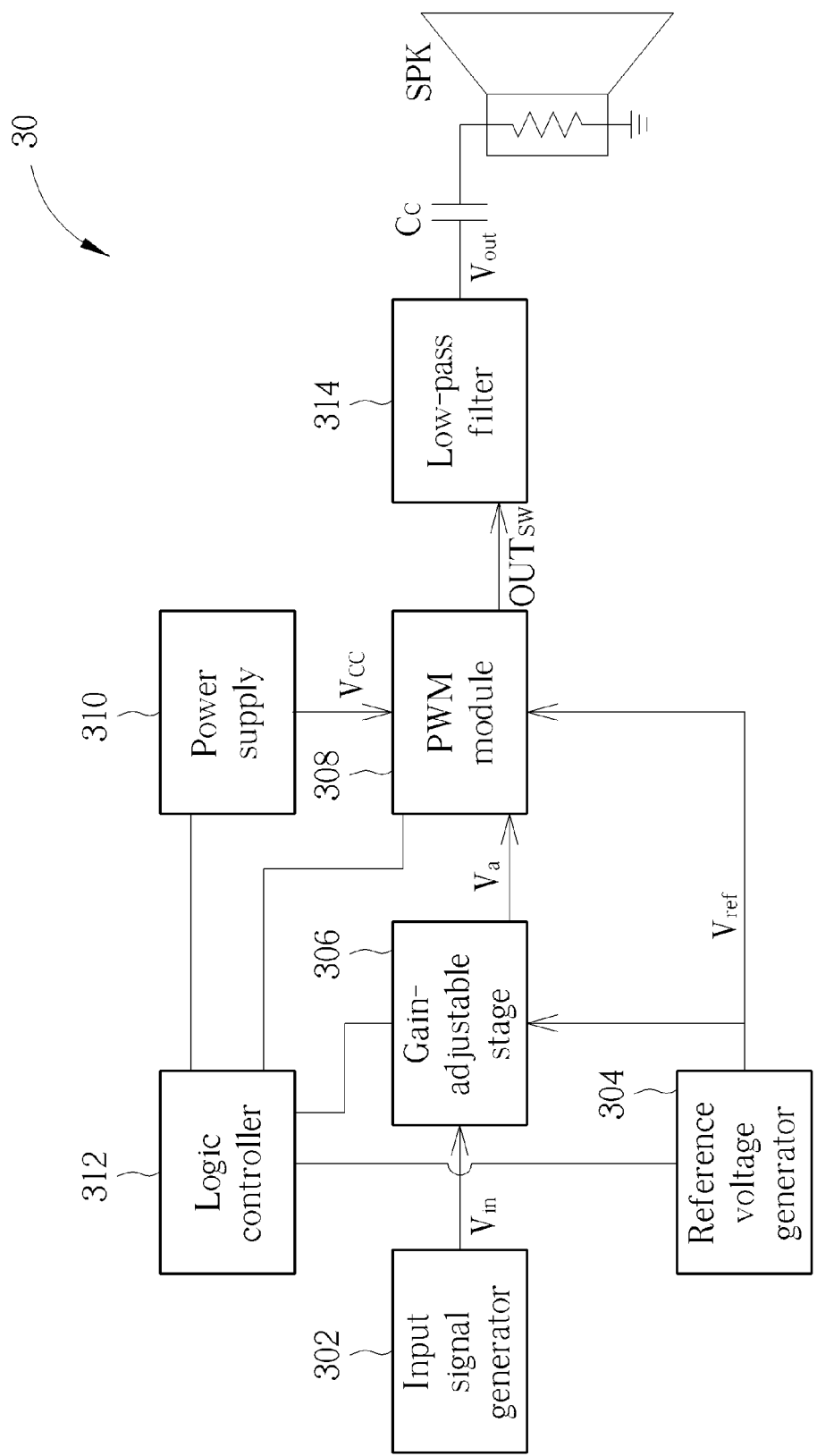
FIG. 3 is a schematic diagram of a single-ended output class-D amplifier possessing a pop-free function according to an embodiment of the present invention.

Please refer to FIG. 3, which is a schematic diagram of a single-ended output class-D amplifier 30 possessing a pop-free function according to an embodiment of the present invention. The single-ended output class-D amplifier 30 includes an input signal generator 302, a reference voltage generator 304, a gain-adjustable stage 306, a pulse width modulation (PWM) module 308, a power supply 310, a logic controller 312, a low-pass filter 314, a coupling capacitor $C_c$, and an electric-to-audio converting device SPK. The input signal generator 302 is utilized for generating an input signal $V_{in}$, such as an electric signal corresponding to an audio content. The reference voltage generator 304 is utilized for generating a reference voltage $V_{ref}$ to provide for the gain-adjustable stage 306 and the pulse width modulation module 308. The reference voltage $V_{ref}$ may be a reference to amplifiers in the gain-adjustable stage 306 and the pulse width modulation module 308 simultaneously. The gain-adjustable stage 306, coupled to the input signal generator 302 and the reference voltage generator 304, is utilized for generating an amplified signal $V_a$ by amplifying the input signal $V_{in}$ according to the reference voltage $V_{ref}$. The gain-adjustable stage 306 may also be utilized for adjusting a gain of the single-ended output class-D amplifier 30. The pulse width modulation module 308, coupled to the reference voltage generator 304 and the gain-adjustable stage 306, is utilized for receiving the amplified signal $V_a$ and the reference voltage $V_{ref}$, and for generating a pulse width modulation signal $OUT_{SW}$. The power supply 310 supplies an input power $V_{CC}$ for the output stage of the pulse width modulation module 308, to provide an output current flowing via the low-pass filter 314 and the coupling capacitor $C_c$ to the electric-to-audio converting device SPK. The logic controller 312 receives the signals from the reference voltage generator 304, the gain-adjustable stage 306, the pulse width modulation module 308, and the power supply 310 to determine which condition the single-ended output class-D amplifier 30 is in, and controls these modules according to different conditions of the single-ended output class-D amplifier 30. At the output part of the single-ended output class-D amplifier 30, the low-pass filter 314 performs filtering on the pulse width modulation signal $OUT_{SW}$ to generate an output voltage $V_{out}$. The coupling capacitor $C_c$ retrieves an alternating current (AC) component of the output voltage $V_{out}$ to provide for the electric-to-audio converting device SPK to output audio signals. The electric-to-audio converting device SPK may be an earphone, a hooter, a hi-fi equipment, a megaphone, a loudspeaker, or any other electric-to-audio converting devices capable of broadcasting sound.

As shown in FIG. 3, the input signal generator 302 generates the input signal $V_{in}$ first. After the input signal $V_{in}$ is amplified by the amplifier in the gain-adjustable stage 306, the amplified signal $V_a$ is generated to be output to the pulse width modulation module 308. The pulse width modulation module 308 performs modulation on the amplified signal $V_a$ to generate the pulse width modulation signal $OUT_{SW}$ to be output to the low-pass filter 314. The low-pass filter 314 performs filtering on the pulse width modulation signal $OUT_{SW}$ to generate the output voltage $V_{out}$. Finally, the coupling capacitor $C_c$ retrieves the AC component of the output voltage $V_{out}$ to provide for the electric-to-audio converting device SPK to output the audio signal to generate sound.

Figure 4A:
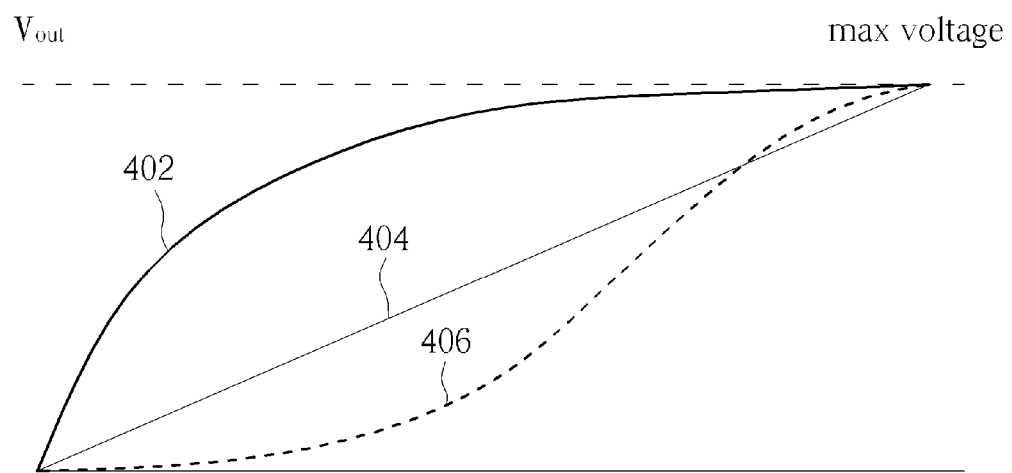
FIG. 4A is a schematic diagram of a reference voltage in a single-ended output class-D amplifier rising with different voltage curves according to an embodiment of the present invention.
Figure 4B:
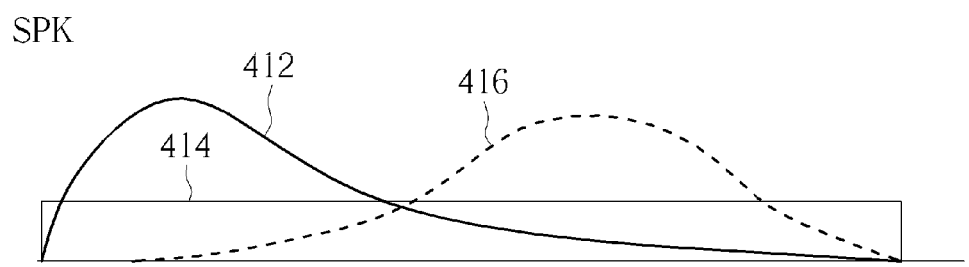
FIG. 4B is a schematic diagram of waveforms of the electric-to-audio converting device corresponding to a reference voltage in a single-ended output class-D amplifier rising with different voltage curves according to an embodiment of the present invention.

Please note that, in order to reduce a popping noise, the single-ended output class-D amplifier 30 has to perform many aspects of signal processing. Please refer to FIG. 4A, which is a schematic diagram of the reference voltage $V_{ref}$ in the single-ended output class-D amplifier 30 rising with different voltage curves. As shown in FIG. 4A, a curve 402 rises in an RC charging manner, a curve 404 rises with a straight line, and a curve 406 rises in an S-shaped manner. Waveforms of the electric-to-audio converting device SPK corresponding to the three curves shown in FIG. 4A are illustrated in FIG. 4B. A waveform 412 corresponds to the curve 402; since the curve 402 approaches the maximum voltage in a shorter time, the waveform 412 has a higher slew rate in the earlier stage. A waveform 414 corresponds to the curve 404; since the curve 404 rises with a straight line, the waveform 414 appears to be a step waveform and a pop may occur easily at the starting and ending time points of the step waveform. A waveform 416 corresponds to the curve 406; since the curve 406 approaches the maximum voltage in a longer time, the waveform 416 rises slower and has a lower slew rate. The reference voltage generator 304 may control the reference voltage $V_{ref}$ to rise or fall stably by coupling a capacitor, and adjust the reference voltage $V_{ref}$ to rise or fall with an S-shaped curve through a variable resistor. Alternatively, the reference voltage generator 304 may utilize other methods to make the reference voltage $V_{ref}$ rise or fall with an S-shaped curve; the methods are not limited herein. In comparison with the curves 402 and 404, if the reference voltage $V_{ref}$ rises with the curve 406 and the output voltage $V_{out}$ is controlled to rise in a fixed ratio with the reference voltage $V_{ref}$, the pop noise generated at the electric-to-audio converting device SPK may be minimized. The method of controlling the reference voltage $V_{ref}$ to fall with the S-shaped curve is also the same, and is therefore not detailed here for brevity.

Figure 5:
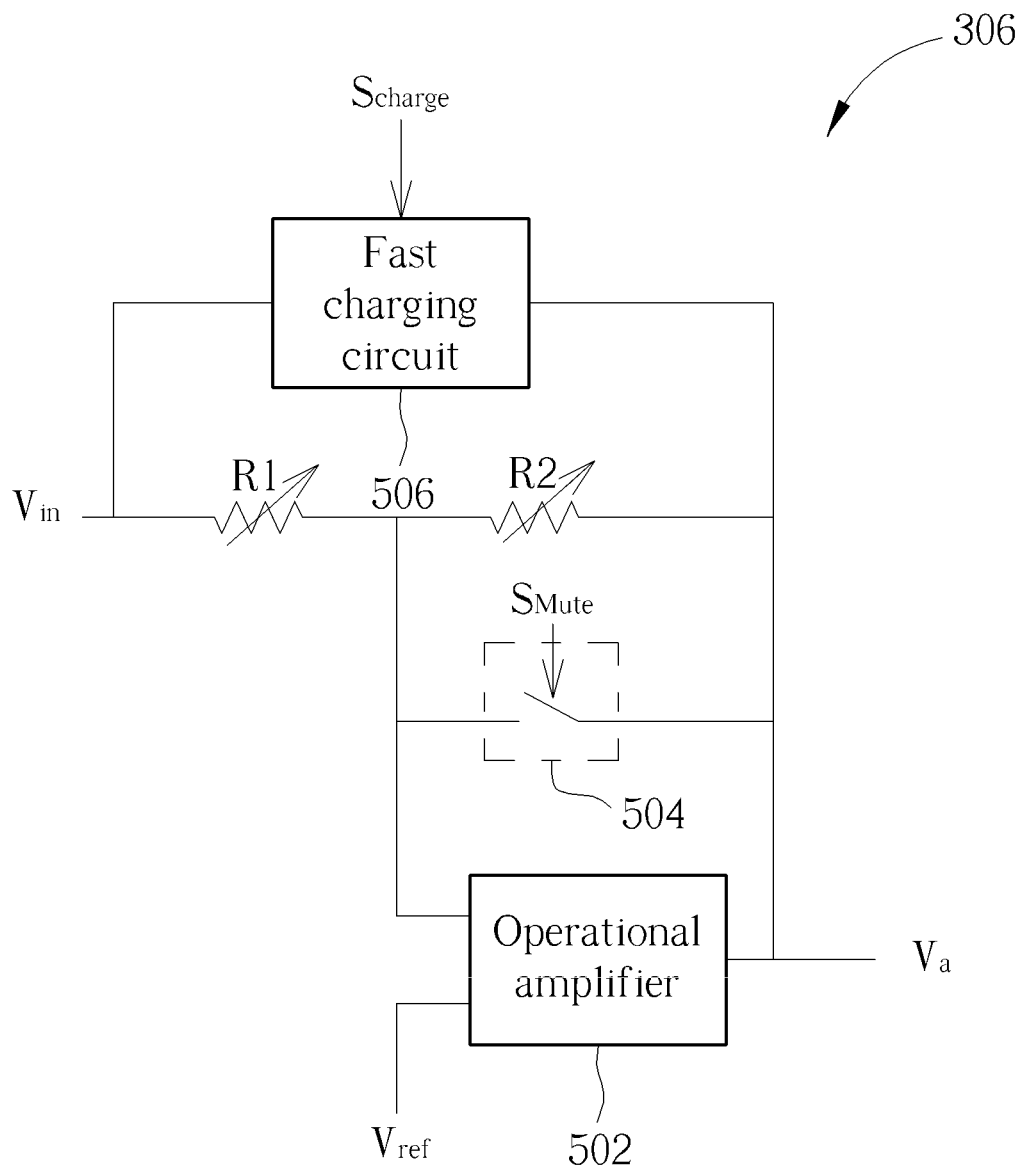
FIG. 5 is a schematic diagram of an embodiment of the gain-adjustable stage in FIG. 3.

Please refer to FIG. 5, which is a schematic diagram of an embodiment of the gain-adjustable stage 306 in FIG. 3. The gain-adjustable stage 306 includes variable resistors R1 and R2, an operational amplifier 502, a mute switch 504, and a fast charging circuit 506. The variable resistors R1 and R2 can adjust the gain of the single-ended output class-D amplifier 30 by varying their respective resistances. The operational amplifier 502 includes an input terminal coupled to the variable resistors R1 and R2, another input terminal coupled to the reference voltage generator 304 to receive the reference voltage $V_{ref}$, and an output terminal for outputting the amplified signal $V_a$. The mute switch 504 is coupled to the variable resistors R1 and R2 and the operational amplifier 502. The control terminal of the mute switch 504 is coupled to the logic controller 312 and controlled by a mute signal $S_{Mute}$. The fast charging circuit 506 is coupled to the input signal generator 302 and the output terminal of the operational amplifier 502. The control terminal of the fast charging circuit 506 is coupled to the logic controller 312 and controlled by a fast charging signal $S_{Charge}$. When the logic controller 312 controls the mute switch 504 to be turned on through the mute signal $S_{Mute}$, the gain of the operational amplifier 502 is zero (i.e. in mute status). At this point, the operational amplifier 502 can be considered as a voltage follower, wherein a voltage of its output terminal is equal to the reference voltage $V_{ref}$, and the input signal $V_{in}$ is isolated simultaneously. If the mute switch 504 and the fast charging circuit 506 are controlled to be turned on simultaneously, the fast charging circuit 506 may charge the input signal $V_{in}$ according to the reference voltage $V_{ref}$ received from the output terminal of the operational amplifier 502. If the mute switch 504 and the fast charging circuit 506 are controlled to be turned off simultaneously, the operational amplifier 502 amplifies the input signal $V_{in}$ to generate the amplified signal $V_a$. At this moment, the gain is −R2/R1.

Figure 6:
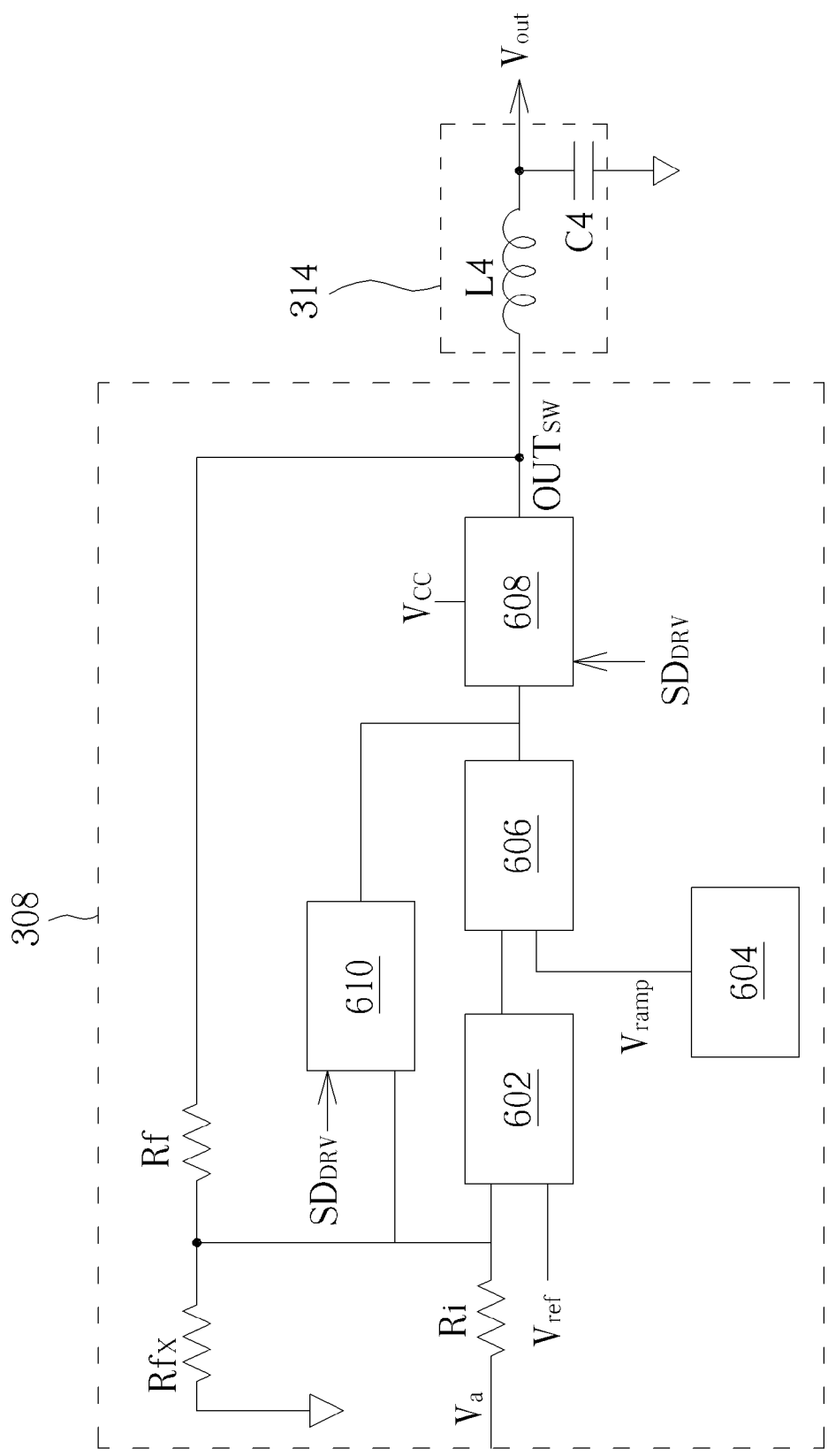
FIG. 6 is a schematic diagram of an embodiment of the pulse width modulation module and the low-pass filter in FIG. 3.

Please refer to FIG. 6, which is a schematic diagram of an embodiment of the pulse width modulation module 308 and the low-pass filter 314 in FIG. 3. The pulse width modulation module 308 includes resistors Ri, Rf, and Rfx, an error amplifier 602, a ramp generator 604, a comparator 606, a driving circuit 608, and an inside feedback path 610. The resistors Ri, Rf, and Rfx is utilized for adjusting a relation between the reference voltage $V_{ref}$ and the pulse width modulation signal $OUT_{SW}$, and controlling a relation between the reference voltage $V_{ref}$ and the output voltage $V_{out}$ accordingly. The error amplifier 602 includes an input terminal coupled to the resistors Ri, Rf, and Rfx, another input terminal coupled to the reference voltage generator 304 for receiving the reference voltage $V_{ref}$, and an output terminal coupled to the comparator 606. The ramp generator 604 is utilized for generating a ramp signal $V_{ramp}$, and frequency of the ramp signal $V_{ramp}$ can determine frequency of the pulse width modulation signal $OUT_{SW}$. The comparator 606 is coupled to the error amplifier 602 and the ramp generator 604, and is utilized for comparing the output signal of the error amplifier 602 and the ramp signal $V_{ramp}$ to generate a signal, which is then amplified by the driving circuit 608 to output the pulse width modulation signal $OUT_{SW}$. The driving circuit 608 is further coupled to the logic controller 312 and the power supply 310. The logic controller 312 can control the driving circuit 608 to be turned on and off through a driving circuit shutdown signal $SD_{DRV}$. The power supply 310 supplies the input power $V_{CC}$ to provide an output current for the driving circuit 608. The driving circuit 608 further provides a base select function for preventing a current from flowing from the output terminal back to the power supply 310 when a voltage of the input power $V_{CC}$ is less than the output voltage $V_{out}$, which causes the output voltage $V_{out}$ to fall rapidly, thereby generating a pop. The inside feedback path 610 includes a terminal coupled between the comparator 606 and the driving circuit 608, and another terminal coupled between the error amplifier 602 and the resistors Ri, Rf, and Rfx, and is utilized for preventing a spike from being generated at the output voltage $V_{out}$ since the loop is unstable at the moment the driving circuit 608 is turned on. This prevents a pop from being generated.

Please keep referring to FIG. 6. The low-pass filter 314 includes an inductor L4 and a capacitor C4, and is utilized for performing low-pass filtering on the pulse width modulation signal $OUT_{SW}$ to generate the output voltage $V_{out}$. The output voltage $V_{out}$ can be any voltage between the voltage of the input power $V_{CC}$ and zero. In some embodiments, the output voltage $V_{out}$ is equal to half of the voltage of the input power $V_{CC}$, such that amplitude of the signal may be maximized. Due to a characteristic of the low-pass filter 314, the output voltage $V_{out}$ is equal to a duty cycle of the pulse width modulation signal $OUT_{SW}$ multiplied by the voltage of the input power $V_{CC}$. When the output voltage $V_{out}$ is equal to half of the voltage of the input power $V_{CC}$, the duty cycle of the pulse width modulation signal $OUT_{SW}$ is 50%, which can be achieved by adjusting the magnitude of the reference voltage $V_{ref}$ and the resistances of the resistors Rf and Rfx. For example, if $V_{out}=V_{CC}/2$, the reference voltage $V_{ref}$ can be adjusted to be $V_{ref}=V_{CC}/8$. At this moment, the reference voltage $V_{ref}=V_{out}/4$, and the resistances can be adjusted accordingly to be Rfx/(Rf+Rfx)=¼. The magnitude of the reference voltage $V_{ref}$ can be determined according to system requirements, which are not limited herein.

The operating frequency of the pulse width modulation module 308 is determined by the ramp generator 604. In general, an audio frequency which can be heard by human ears is within 20 Hz~20 kHz, and thus the frequency of the pulse width modulation signal $OUT_{SW}$ can be determined as a frequency far greater than 20 kHz (500 kHz, for example) to prevent additional sounds from being generated and to output the pulse width modulation signal $OUT_{SW}$ with low distortion.

Figure 7:
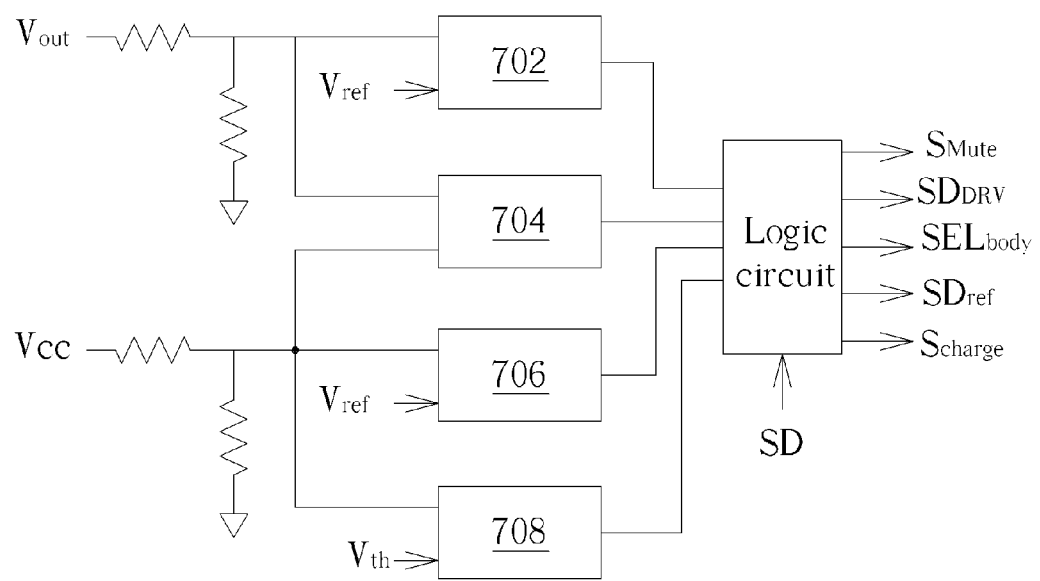
FIG. 7 is a schematic diagram of an embodiment of the logic controller in FIG. 3.

Please refer to FIG. 7, which is a schematic diagram of an embodiment of the logic controller 312 in FIG. 3. The logic controller 312 includes comparators 702, 704, 706, and 708, for receiving a shutdown signal SD, the input power $V_{CC}$, the reference voltage $V_{ref}$, the output voltage $V_{out}$, and a threshold voltage $V_{th}$, to generate the mute signal $S_{Mute}$, the fast charging signal $S_{Charge}$, the driving circuit shutdown signal $SD_{DRV}$, a reference voltage shutdown signal $SD_{ref}$, and a base select signal $SEL_{body}$. The comparator 702 is utilized for determining whether to start to build up a bias of the output voltage $V_{out}$ according to the relation between the output voltage $V_{out}$ and the reference voltage $V_{ref}$ when the power supply 310 is turned on or the shutdown signal SD is released. The comparator 704 is utilized for determining whether to activate the base select function and to send the base select signal $SEL_{body}$ to the driving circuit 608 according to the relation between the voltage of the input power $V_{CC}$ and the output voltage $V_{out}$ when the power supply 310 is turned off. The comparator 706 is utilized for determining whether the bias is fully built up according to the relation between the voltage of the input power $V_{CC}$ and the reference voltage $V_{ref}$ when the reference voltage generator 304 is building up the bias of the output voltage $V_{out}$. The comparator 708 is utilized for determining whether the single-ended output class-D amplifier 30 enters an under voltage lock-out (UVLO) mode according to the relation between the voltage of the input power $V_{CC}$ and the threshold voltage $V_{th}$ when the power supply 310 is turned off. In addition, the externally controlled shutdown signal SD can control the single-ended output class-D amplifier 30 to be turned on or off when the input power $V_{CC}$ is on. According to the comparison results of the comparators 702~708 and the control of the shutdown signal SD, the logic controller 312 can generate a plurality of control signals to control the operation of the single-ended output class-D amplifier 30 under different operating modes. For example, the logic controller 312 can control the mute switch 504 and the fast charging circuit 506 in the gain-adjustable stage 306 to be turned on/off through the mute signal $S_{Mute}$ and the fast charging signal $S_{charge}$ respectively, control the reference voltage generator 304 to charge/discharge the reference voltage $V_{ref}$ through the reference voltage shutdown signal $SD_{ref}$, control the driving circuit 608 to be turned on/off through the driving circuit shutdown signal $SD_{DRV}$, and control the driving circuit 608 to activate the base select function through the base select signal $SEL_{body}$.

The operation related to the logic controller 312 in the single-ended output class-D amplifier 30 can be summarized into an operation process 80. As shown in FIG. 8, the operation process 80 includes the following steps:

Step 800: Start.

Step 802: Detect the power supply 310 is turned on or the shutdown signal SD is released.

Step 804: Execute a bias build-up process 90.

Step 806: The single-ended output class-D amplifier 30 enters a normal operating mode to output the output voltage $V_{out}$ according to the input signal $V_{in}$ Step 808: Determine whether the shutdown signal SD is activated. If yes, execute a shutdown process 110; otherwise, execute Step 806.

Step 810: Determine whether the voltage of the input power $V_{CC}$ falls rapidly and its falling speed is greater than the falling speed of the reference voltage $V_{ref}$. If yes, execute a rapid power off process 160; otherwise, execute Step 806.

Step 812: Determine whether the voltage of the input power $V_{CC}$ falls slowly and below the threshold voltage $V_{th}$. If yes, execute a slow power off process 170; otherwise, execute Step 806.

Step 814: End.

According to the operation process 80, when the power supply 310 is turned on or the shutdown signal SD is released, the single-ended output class-D amplifier 30 enters a bias build-up mode first. Detailed description of the bias build-up mode will be illustrated in the bias build-up process 90. After the bias is fully built up, the single-ended output class-D amplifier 30 enters a normal operating mode. At this moment, the single-ended output class-D amplifier 30 amplifies the input signal $V_{in}$ to generate the amplified signal $V_a$, and the pulse width modulation module 308 performs modulation on the amplified signal $V_a$ to generate the pulse width modulation signal $OUT_{SW}$. Then the low-pass filter 314 performs filtering on the pulse width modulation signal $OUT_{SW}$ to generate the output voltage $V_{out}$. The coupling capacitor $C_c$ further retrieves the AC component of the output voltage $V_{out}$ so that the electric-to-audio converting device SPK can output the audio signal for generating sound. At this point, the logic controller 312 may detect the shutdown signal SD and the input power $V_{CC}$. When determining the shutdown signal SD is activated, the logic controller 312 may execute the shutdown process 110. When determining the voltage of the input power $V_{CC}$ falls rapidly and its falling speed is greater than the falling speed of the reference voltage $V_{ref}$, the logic controller 312 may execute the rapid power off process 160. When determining the voltage of the input power $V_{CC}$ falls slowly and below the threshold voltage $V_{th}$, the single-ended output class-D amplifier 30 enters the UVLO mode, and the logic controller 312 may execute the slow power off process 170.

Figure 9A:
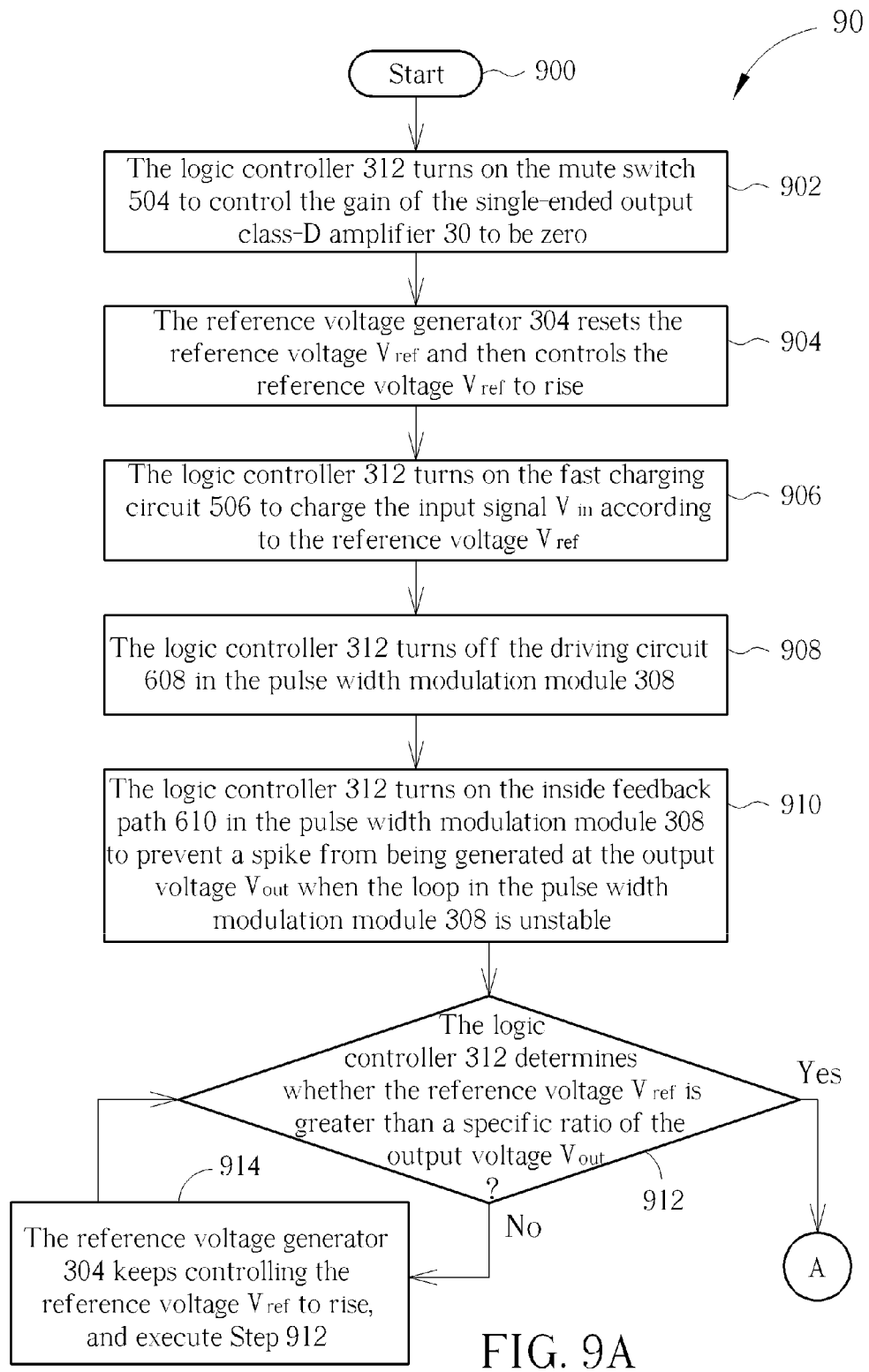
FIG. 9A and FIG. 9B are schematic diagrams of a bias build-up process according to an embodiment of the present invention.
Figure 9B:
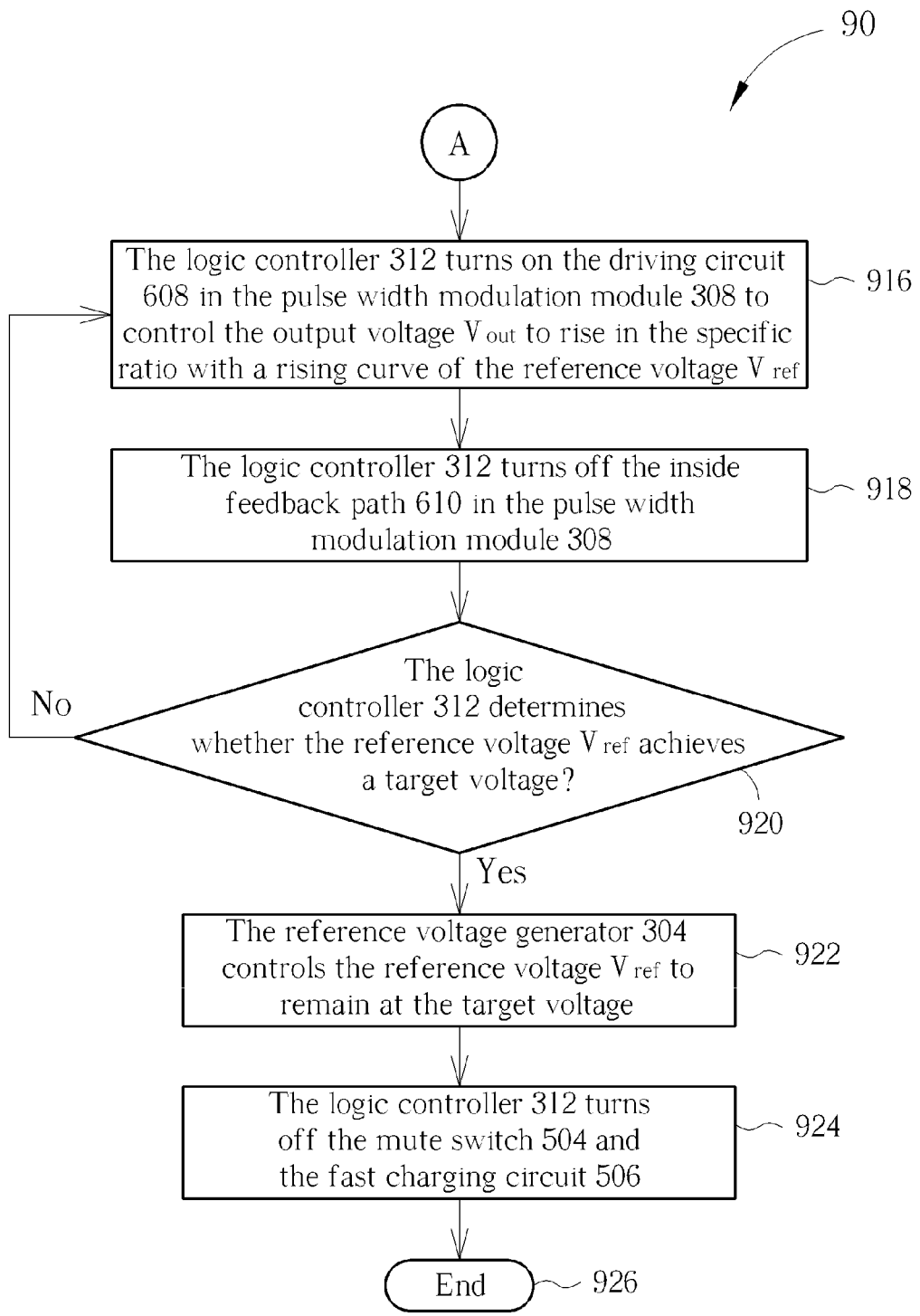

As shown in FIG. 9A and FIG. 9B, the bias build-up process 90 of the single-ended output class-D amplifier 30 includes the following steps:

Step 900: Start.

Step 902: The logic controller 312 turns on the mute switch 504 to control the gain of the single-ended output class-D amplifier 30 to be zero.

Step 904: The reference voltage generator 304 resets the reference voltage $V_{ref}$ and then controls the reference voltage $V_{ref}$ to rise.

Step 906: The logic controller 312 turns on the fast charging circuit 506 to charge the input signal $V_{in}$ according to the reference voltage $V_{ref}$.

Step 908: The logic controller 312 turns off the driving circuit 608 in the pulse width modulation module 308.

Step 910: The logic controller 312 turns on the inside feedback path 610 in the pulse width modulation module 308 to prevent a spike from being generated at the output voltage $V_{out}$ when the loop in the pulse width modulation module 308 is unstable.

Step 912: The logic controller 312 determines whether the reference voltage $V_{ref}$ is greater than a specific ratio of the output voltage $V_{out}$. If yes, execute Step 916; otherwise, execute Step 914.

Step 914: The reference voltage generator 304 keeps controlling the reference voltage $V_{ref}$ to rise, and execute Step 912.

Step 916: The logic controller 312 turns on the driving circuit 608 in the pulse width modulation module 308 to control the output voltage $V_{out}$ to rise in the specific ratio with a rising curve of the reference voltage $V_{ref}$.

Step 918: The logic controller 312 turns off the inside feedback path 610 in the pulse width modulation module 308.

Step 920: The logic controller 312 determines whether the reference voltage $V_{ref}$ achieves a target voltage. If yes, execute 922; otherwise, execute Step 916.

Step 922: The reference voltage generator 304 controls the reference voltage $V_{ref}$ to remain at the target voltage.

Step 924: The logic controller 312 turns off the mute switch 504 and the fast charging circuit 506.

Step 926: End.

Figure 10A:
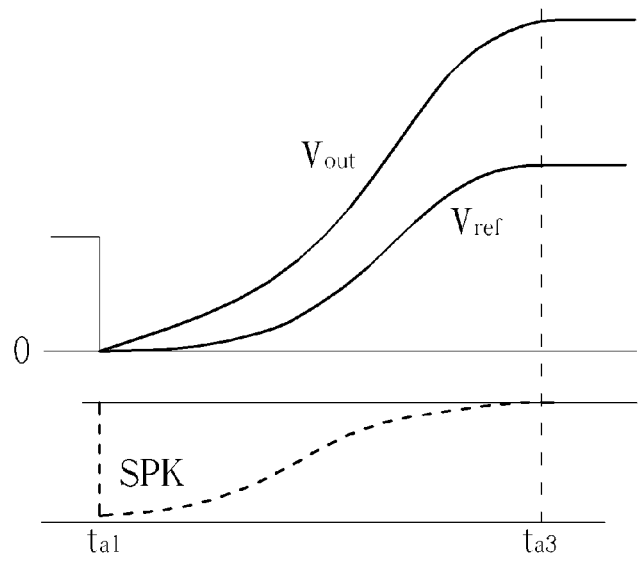
FIG. 10A is a schematic diagram of the power supply being turned on or the shutdown signal being released when the output voltage is not fully discharged.

According to the bias build-up process 90, when detecting the power supply 310 is turned on or the shutdown signal SD is released, the logic controller 312 does not initially control the output voltage $V_{out}$ to rise with a rising curve of the reference voltage $V_{ref}$. Instead, only once the reference voltage $V_{ref}$ is greater than a specific ratio of the output voltage $V_{out}$, will the logic controller 312 turn on the driving circuit 608 in the pulse width modulation module 308 to control the output voltage $V_{out}$ to rise with the rising curve of the reference voltage $V_{ref}$. The coupling capacitor $C_c$ always has a substantial capacitance (e.g. 100 micro Farads), and hence when the power supply 310 is turned off or the shutdown signal SD is activated, it takes a long time for the output voltage $V_{out}$ to be fully discharged. After the power supply 310 is turned off or the shutdown signal SD is activated for a certain amount of time, the output voltage $V_{out}$ is not fully discharged and is located in a certain voltage level between the voltage of the input power $V_{CC}$ and zero and the reference voltage $V_{ref}$ has been fully discharged to zero, if the power supply 310 is turned on or the shutdown signal SD is released, the output voltage $V_{out}$ may start to follow the reference voltage $V_{ref}$ and change suddenly if the driving circuit 608 is directly turned on. Please refer to FIG. 10A, which is a schematic diagram of the power supply 310 being turned on or the shutdown signal SD being released when the output voltage $V_{out}$ is not fully discharged. As shown in FIG. 10A, at time $t_{a1}$, when the power supply 310 is turned on or the shutdown signal SD is released, if the driving circuit 608 is directly turned on to control the output voltage $V_{out}$ to rise with the rising curve of the reference voltage $V_{ref}$, the output voltage $V_{out}$ may suddenly discharge to zero from a certain voltage level since the reference voltage $V_{ref}$ is zero but the output voltage $V_{out}$ is not zero originally, so as to generate a pop at the electric-to-audio converting device SPK.

Figure 10B:
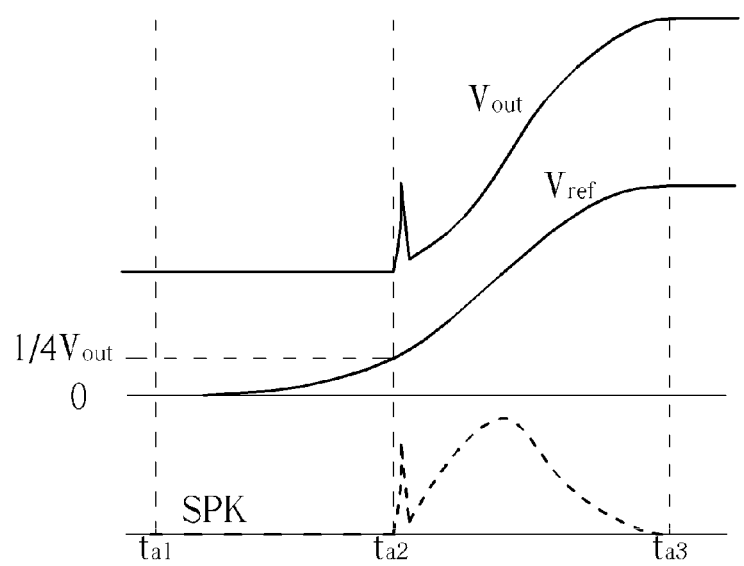
FIG. 10B is a schematic diagram of the power supply being turned on or the shutdown signal being released without the inside feedback path.

When the driving circuit 608 in the pulse width modulation module 308 is turned off, the pulse width modulation module 308 appears to be in an open loop status. At the moment of the driving circuit 608 being turned on, it will therefore take a period of time for the loop in the pulse width modulation module 308 to become stable, and the length of this period of time may be according to bandwidth of the pulse width modulation module 308. However, the bandwidth is limited to a phase margin and cannot be increased unlimitedly. Therefore, as shown in FIG. 10B, which is a schematic diagram of the power supply 310 being turned on or the shutdown signal SD being released without the inside feedback path 610, at time $t_{a2}$, at the moment of the driving circuit 608 being turned on so that the loop is not yet stable, a spike may be generated at the output voltage $V_{out}$ which generates a pop at the electric-to-audio converting device SPK. Before the logic controller 312 controls the driving circuit 608 to be turned on through the driving circuit shutdown signal $SD_{DRV}$, the inside feedback path 610 in the pulse width modulation module 308 has to be turned on first, to stable the internal loop of the pulse width modulation module 308 in advance. When the driving circuit 608 is turned on, the inside feedback path 610 is turned off simultaneously to prevent a spike from being generated at the output voltage $V_{out}$, which further prevents a pop from being generated at the electric-to-audio converting device SPK.

Figure 10C:
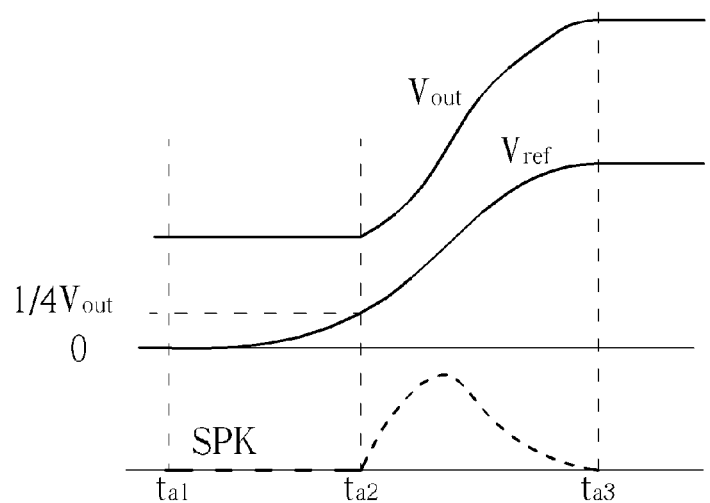
FIG. 10C is a schematic diagram of the power supply being turned on or the shutdown signal being released according to an embodiment of the present invention.

Please refer to FIG. 10C, which is a schematic diagram of the power supply 310 being turned on or the shutdown signal SD being released according to an embodiment of the present invention. As shown in FIG. 10C, at time $t_{a1}$, when the logic controller 312 detects the power supply 310 is turned on or the shutdown signal SD is released, the logic controller 312 does not initially control the output voltage $V_{out}$ to rise with the rising curve of the reference voltage $V_{ref}$. At this point, the output terminal is in a high impedance status, and thus the output voltage $V_{out}$ may fall with an extremely slow speed or remain constant. The reference voltage generator 304 resets the reference voltage $V_{ref}$ and starts to control the reference voltage $V_{ref}$ to rise. Preferably, when the reference voltage $V_{ref}$ rises with the S-shaped curve, the pop noise generated at the electric-to-audio converting device SPK may be minimized. In the gain-adjustable stage 306, the logic controller 312 may turn on the mute switch 504 through the mute signal $S_{Mute}$ to control the gain of the single-ended output class-D amplifier 30 to be zero. At this point, the operational amplifier 502 can be considered as a voltage follower, wherein the voltage of its output terminal is equal to the reference voltage $V_{ref}$, and the input signal $V_{in}$ is isolated simultaneously. The logic controller 312 then controls the fast charging circuit 506 to be turned on through the fast charging signal $S_{Charge}$ to charge the input signal $V_{in}$ according to the reference voltage $V_{ref}$. In the pulse width modulation module 308, the logic controller 312 controls the driving circuit 608 to be turned off through the driving circuit shutdown signal $SD_{DRV}$, and turns on the inside feedback path 610 simultaneously to prevent a spike from being generated at the output voltage $V_{out}$, which prevents the pop.

The logic controller 312 determines whether the reference voltage $V_{ref}$ is greater than a specific ratio of the output voltage $V_{out}$. When the reference voltage $V_{ref}$ achieves the specific ratio of the output voltage $V_{out}$, the logic controller 312 controls the driving circuit 608 to be turned on through the driving circuit shutdown signal $SD_{DRV}$, such that the output voltage $V_{out}$ can start to rise with the rising curve of the reference voltage $V_{ref}$. Since the output voltage $V_{out}$ rises in the specific ratio with the rising curve of the reference voltage $V_{ref}$, the output voltage $V_{out}$ will not change suddenly, so the pop is not generated. For example, as shown in FIG. 10B and FIG. 10C, at time $t_{a2}$, when the reference voltage $V_{ref}$ achieves ¼ of the output voltage $V_{out}$, the logic controller 312 controls the driving circuit 608 to be turned on through the driving circuit shutdown signal $SD_{DRV}$, such that the output voltage $V_{out}$ can start to rise with the rising curve of the reference voltage $V_{ref}$. The resistors Rf and Rfx in the pulse width modulation module 308 are adjusted, such that the reference voltage $V_{ref}$ and the output voltage $V_{out}$ can rise in a ratio of $V_{ref}=V_{out}/4$. Since the specific ratio where the output voltage $V_{out}$ starts to rise and the ratio of the output voltage $V_{out}$ rising with the rising curve of the reference voltage $V_{ref}$ are the same, the output voltage $V_{out}$ will not change suddenly, preventing the pop from being generated. At this moment, since the feedback loop via the resistors to the error amplifier 602 in the driving circuit 608 has been stable, the logic controller 312 can turn off the inside feedback path 610.

The logic controller 312 determines whether the reference voltage $V_{ref}$ achieves a target voltage. At time $t_{a3}$, when the reference voltage $V_{ref}$ achieves the target voltage, the reference voltage generator 304 controls the reference voltage $V_{ref}$ to remain at the target voltage. For example, in some embodiments, the voltage setting $V_{out}=V_{CC}/2$ may cause the signal amplitude to be maximized. Since the reference voltage $V_{ref}$ and the output voltage $V_{out}$ have a relation of $V_{ref}=V_{out}/4$ the target voltage of the reference voltage $V_{ref}$ will be $V_{CC}/8$. At this moment, the bias is fully built up, wherein the reference voltage $V_{ref}$ remains at the target voltage, the output voltage $V_{out}$ is equal to half of the voltage of the input power $V_{CC}$, and the bias voltage of the input signal $V_{in}$ is equal to the reference voltage $V_{ref}$.

The logic controller 312 controls the mute switch 504 to be turned off through the mute signal $S_{Mute}$ and controls the fast charging circuit 506 to be turned off through the fast charging signal $S_{Charge}$, and thus the single-ended output class-D amplifier 30 can enter a normal operating mode.

Figure 11:
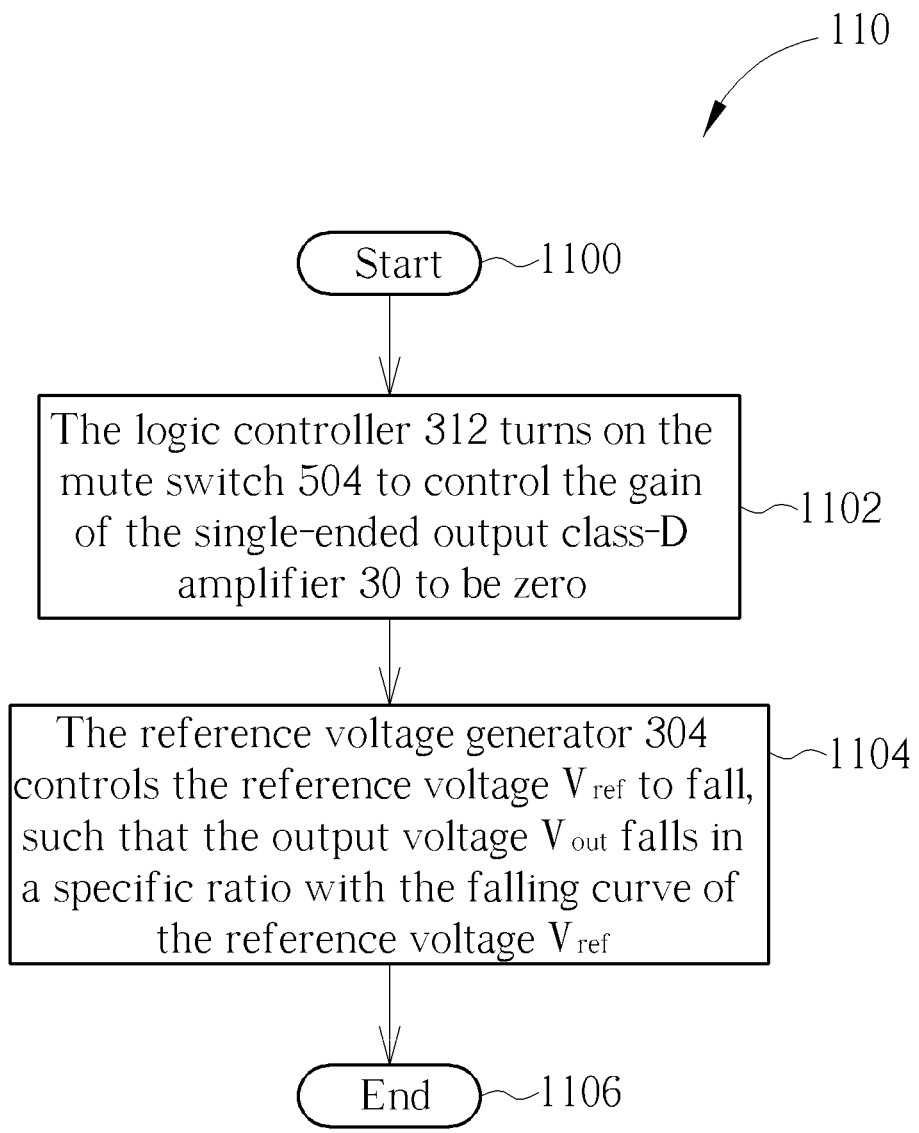
FIG. 11 is a schematic diagram of a shutdown process according to an embodiment of the present invention.

In the normal operating mode of the single-ended output class-D amplifier 30, the logic controller 312 keeps detecting the shutdown signal SD and the input power $V_{CC}$ to determine when to enter a shutdown mode or a power off mode. When the logic controller 312 detects the shutdown signal SD is activated, the single-ended output class-D amplifier 30 starts to execute the shutdown process 110. As shown in FIG. 11, the shutdown process 110 includes the following steps:

Step 1100: Start.

Step 1102: The logic controller 312 turns on the mute switch 504 to control the gain of the single-ended output class-D amplifier 30 to be zero.

Step 1104: The reference voltage generator 304 controls the reference voltage $V_{ref}$ to fall, such that the output voltage $V_{out}$ falls in a specific ratio with the falling curve of the reference voltage $V_{ref}$.

Step 1106: End.

Figure 12:
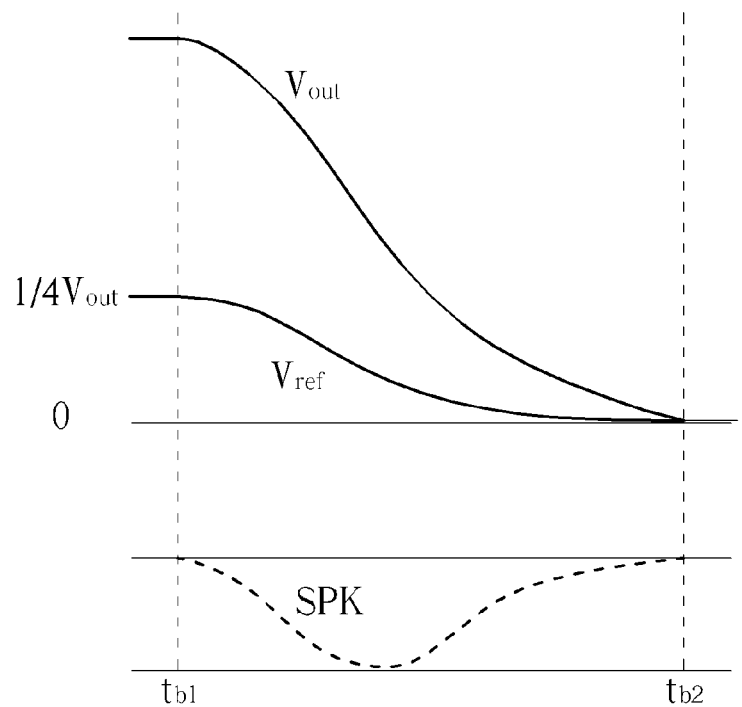
FIG. 12 is a schematic diagram of the shutdown signal being activated according to an embodiment of the present invention.

According to the shutdown process 110, when detecting the shutdown signal SD is activated, the logic controller 312 may turn on the mute switch 504 first to control the gain of the single-ended output class-D amplifier 30 to be zero, to prevent the input signal $V_{in}$ from being amplified continuously to generate sound at the electric-to-audio converting device SPK. At this moment, the reference voltage generator 304 controls the reference voltage $V_{ref}$ to fall, such that the output voltage $V_{out}$ falls in a specific ratio with the falling curve of the reference voltage $V_{ref}$. Please refer to FIG. 12, which is a schematic diagram of the shutdown signal SD being activated. As shown in FIG. 12, at time $t_{b1}$, when the reference voltage $V_{ref}$ is falling, the output voltage $V_{out}$ falls with the falling curve of the reference voltage $V_{ref}$, and the relation between the reference voltage $V_{ref}$ and the output voltage $V_{out}$ remains $V_{ref} = V_{out}/4$. Until $V_{ref} = V_{out} = 0$ (i.e. at time $t_{b2}$), the reference voltage $V_{ref}$ is fully discharged and the shutdown process 110 is finished. Preferably, when the reference voltage $V_{ref}$ falls with an S-shaped curve, the pop noise generated at the electric-to-audio converting device SPK may be minimized.

Figure 13:
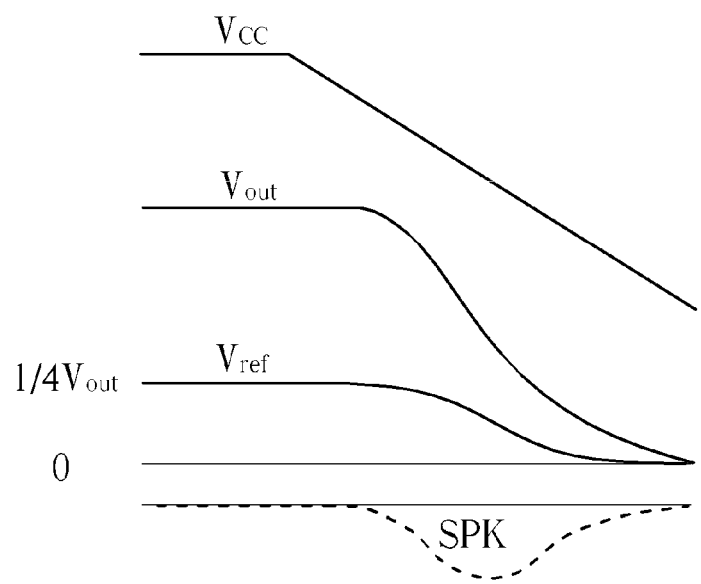
FIG. 13 is a schematic diagram of the voltage of the input power falling in a proper speed according to an embodiment of the present invention.

When the logic controller 312 detects the power supply 310 is turned off, the voltage of the input power $V_{CC}$ may fall. Please refer to FIG. 13, which is a schematic diagram of the voltage of the input power $V_{CC}$ falls in a proper speed. As shown in FIG. 13, if the voltage of the input power $V_{CC}$ falls in a proper speed and its falling speed is less than the falling speed of the reference voltage $V_{ref}$, the reference voltage generator 304 controls the reference voltage $V_{ref}$ to fall, such that the output voltage $V_{out}$ falls in a specific ratio with the falling curve of the reference voltage $V_{ref}$. Preferably, when the reference voltage $V_{ref}$ falls with an S-shaped curve, the pop noise generated at the electric-to-audio converting device SPK may be minimized.

Figure 14:
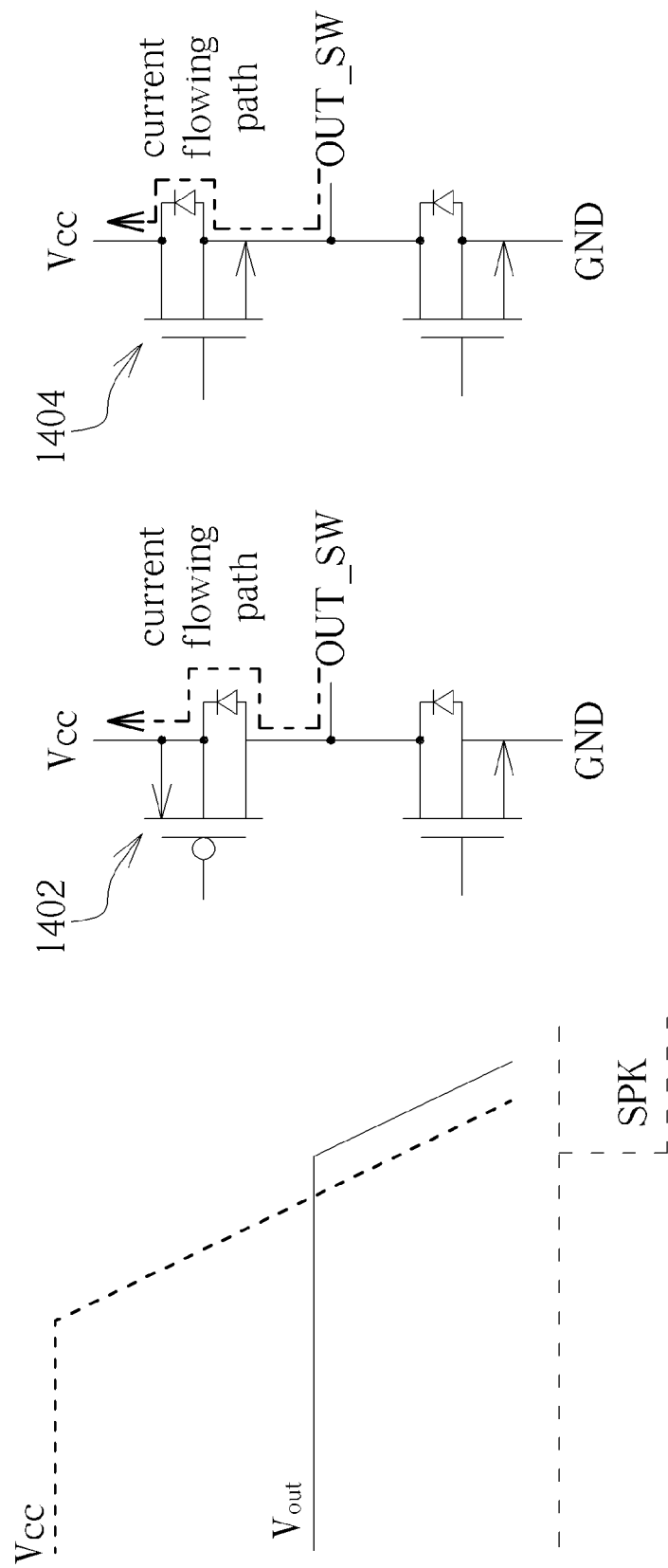
FIG. 14A is a schematic diagram of the voltage of the input power falling rapidly without the base select function according to an embodiment of the present invention.
FIG. 14B and FIG. 14C are schematic diagrams of a driving circuit.

In addition, please refer to FIG. 14A, which is a schematic diagram of the voltage of the input power $V_{CC}$ falling rapidly without the base select function. As shown in FIG. 14A, if the voltage of the input power $V_{CC}$ falls rapidly and its falling speed is far greater than the falling speed of the reference voltage $V_{ref}$, the output voltage $V_{out}$ may fall rapidly with the voltage of the input power $V_{CC}$ and can not fall in a specific ratio with the falling curve of the reference voltage $V_{ref}$, so as to generate a pop at the electric-to-audio converting device SPK. Please refer to FIG. 14B and FIG. 14C, which are schematic diagrams of a driving circuit. In FIG. 14B, the high-side transistor of the driving circuit is a p-type metal oxide semiconductor transistor (PMOS) 1402, and the base of the PMOS transistor 1402 is coupled to the input power $V_{CC}$. In FIG. 14C, the high-side transistor of the driving circuit is an n-type metal oxide semiconductor transistor (NMOS) 1404, and the base of the NMOS transistor 1404 is coupled to an output terminal OUT_SW. When the voltage of the input power $V_{CC}$ falls rapidly and below the output voltage $V_{out}$, a current flows from the output terminal OUT_SW via a parasitic diode of the transistor 1402 or the transistor 1404 to the input power $V_{CC}$, which causes the output voltage $V_{out}$ to fall rapidly with the voltage of the input power $V_{CC}$.

Figure 15:
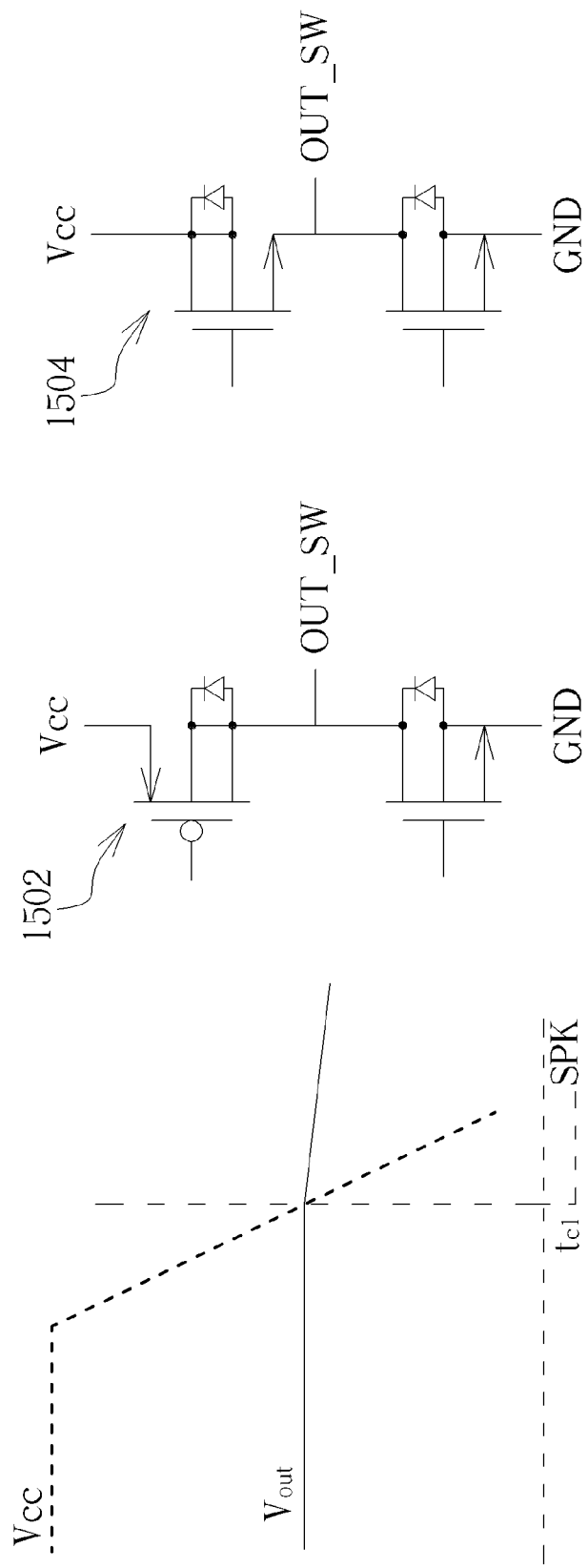
FIG. 15A is a schematic diagram of the voltage of the input power falling rapidly to activate the base select function according to an embodiment of the present invention.
FIG. 15B and FIG. 15C are schematic diagrams of the driving circuit with the base select function activated.

When the voltage of the input power $V_{CC}$ falls rapidly and its falling speed is far greater than the falling speed of the reference voltage $V_{ref}$, the logic controller 312 may control the driving circuit 608 to activate the base select function through the base select signal $SEL_{body}$, which prevents the current from flowing from the output terminal OUT_SW to the input power $V_{CC}$, which causes the output voltage $V_{out}$ to fall rapidly with the voltage of the input power $V_{CC}$. This is illustrated in FIG. 15A, which is a schematic diagram of the voltage of the input power $V_{CC}$ falling rapidly to activate the base select function. As shown in FIG. 15A, if the voltage of the input power $V_{CC}$ falls rapidly and the falling speed is far greater than the falling speed of the reference voltage $V_{ref}$, at the moment of the input power $V_{CC}$ falling below the output voltage $V_{out}$ (i.e. at time $t_{c1}$), the base select function is activated. At this moment, the output voltage $V_{out}$ may start to fall slowly and a tiny pop may be generated at the electric-to-audio converting device SPK at the time $t_{c1}$. This pop is far smaller than the pop shown in FIG. 14A such that it may not even be heard.

Detailed operations of the base select function are illustrated in FIG. 15B and FIG. 15C, which are schematic diagrams of the driving circuit 608 with the base select function activated. As shown in FIG. 15B, the high-side transistor of the driving circuit 608 is a PMOS transistor 1502, and the base of the PMOS transistor 1502 is coupled to the input power $V_{CC}$. When the voltage of the input power $V_{CC}$ falls rapidly and below the output voltage $V_{out}$ (i.e. at time $t_{c1}$), the logic controller 312 controls the base of the PMOS transistor 1502 to be switched to the output terminal OUT_SW through the base select signal $SEL_{body}$, such that the current cannot flow from the output terminal OUT_SW via the parasitic diode of the transistor 1502 to the input power $V_{CC}$. As shown in FIG. 15C, the high-side transistor of the driving circuit 608 is an NMOS transistor 1504, and the base of the NMOS transistor 1504 is coupled to the output terminal OUT_SW. When the voltage of the input power $V_{CC}$ falls rapidly and below the output voltage $V_{out}$ (i.e. at time $t_{c1}$), the logic controller 312 controls the base of the NMOS transistor 1504 to be switched to the input power $V_{CC}$ through the base select signal $SEL_{body}$, such that the current cannot flow from the output terminal OUT_SW via the parasitic diode of the transistor 1504 to the input power $V_{CC}$.

Figure 16:
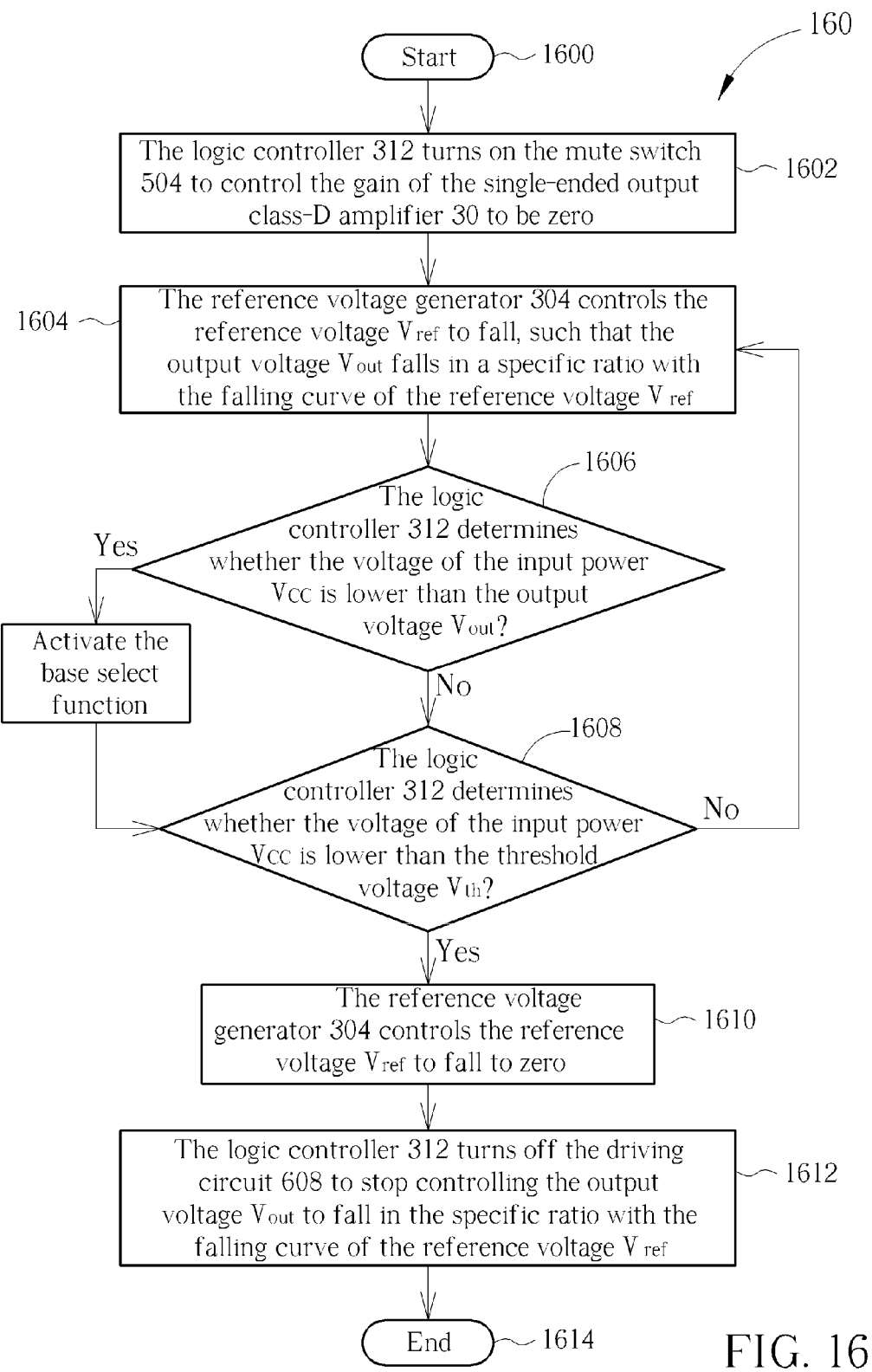
FIG. 16 is a schematic diagram of a rapid power off process according to an embodiment of the present invention.

In combination with the above base select function, when the voltage of the input power $V_{CC}$ falls rapidly and its falling speed is greater than the falling speed of the reference voltage $V_{ref}$, the operation of the single-ended output class-D amplifier 30 can be summarized into the rapid power off process 160. As shown in FIG. 16, the rapid power off process 160 includes the following steps:

Step 1600: Start.

Step 1602: The logic controller 312 turns on the mute switch 504 to control the gain of the single-ended output class-D amplifier 30 to be zero.

Step 1604: The reference voltage generator 304 controls the reference voltage $V_{ref}$ to fall, such that the output voltage $V_{out}$ falls in a specific ratio with the falling curve of the reference voltage $V_{ref}$.

Step 1606: The logic controller 312 determines whether the voltage of the input power $V_{CC}$ is lower than the output voltage $V_{out}$. If yes, activate the base select function and execute Step 1608; otherwise, execute Step 1608.

Step 1608: The logic controller 312 determines whether the voltage of the input power $V_{CC}$ is lower than the threshold voltage $V_{th}$. If yes, execute Step 1610; otherwise, execute Step 1604.

Step 1610: The reference voltage generator 304 controls the reference voltage $V_{ref}$ to fall to zero.

Step 1612: The logic controller 312 turns off the driving circuit 608 to stop controlling the output voltage $V_{out}$ to fall in the specific ratio with the falling curve of the reference voltage $V_{ref}$.

Step 1614: End.

According to the rapid power off process 160, when detecting that the voltage of the input power $V_{CC}$ is falling rapidly and that its falling speed is greater than the falling speed of the reference voltage $V_{ref}$, the logic controller 312 may turn on the mute switch 504 first to control the gain of the single-ended output class-D amplifier 30 to be zero, which prevents the input signal $V_{in}$ from being amplified continuously to generate sound at the electric-to-audio converting device SPK. At this moment, the reference voltage generator 304 controls the reference voltage $V_{ref}$ to fall, such that the output voltage $V_{out}$ falls in a specific ratio with the falling curve of the reference voltage $V_{ref}$. Preferably, when the reference voltage $V_{ref}$ falls with an S-shaped curve, the pop noise generated at the electric-to-audio converting device SPK may be minimized. At this point, the logic controller 312 may determine whether the voltage of the input power $V_{CC}$ is lower than the output voltage $V_{out}$. If the voltage of the input power $V_{CC}$ is lower than the output voltage $V_{out}$, the logic controller 312 may control the driving circuit 608 to activate the base select function through the base select signal $SEL_{body}$ to prevent a current from flowing from the output terminal OUT_SW of the driving circuit 608 to the input power $V_{CC}$, which causes the output voltage $V_{out}$ to fall with the voltage of the input power $V_{CC}$. Detailed operations of the base select function can be known by referring to the above paragraphs, and are therefore not narrated hereinafter.

The logic controller 312 determines whether the voltage of the input power $V_{CC}$ is lower than the threshold voltage $V_{th}$. When the voltage of the input power $V_{CC}$ is lower than the threshold voltage $V_{th}$, the single-ended output class-D amplifier 30 enters the UVLO mode. At this moment, the reference voltage generator 304 controls the reference voltage $V_{ref}$ to fall to zero, to wait until a next time the power supply 310 is turned on and then charged again. The logic controller 312 controls the driving circuit 608 to be turned off through the driving circuit shutdown signal $SD_{DRV}$. At this moment, the output terminal enters a high impedance status, and hence the output voltage $V_{out}$ may fall with an extremely slow speed.

Figure 17:
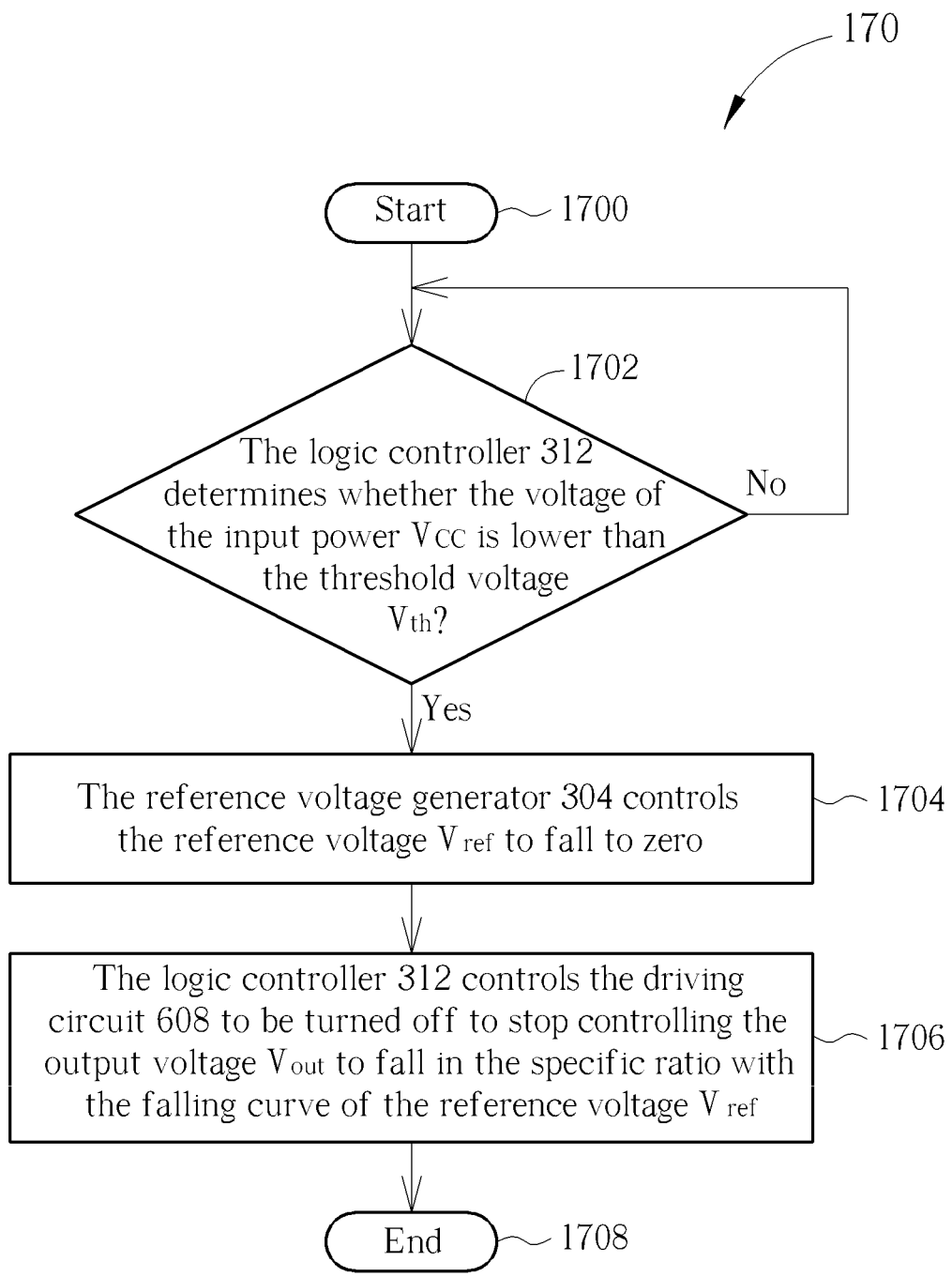
FIG. 17 is a schematic diagram of a slow power off process according to an embodiment of the present invention.

When the voltage of the input power $V_{CC}$ falls slowly and its falling speed is less than the falling speed of the reference voltage $V_{ref}$, the operation of the single-ended output class-D amplifier 30 can be summarized into the slow power off process 170. As shown in FIG. 17, the slow power off process 170 includes the following steps:

Step 1700: Start.

Step 1702: The logic controller 312 determines whether the voltage of the input power $V_{CC}$ is lower than the threshold voltage $V_{th}$. If yes, execute Step 1704; otherwise, keep executing Step 1702.

Step 1704: The reference voltage generator 304 controls the reference voltage $V_{ref}$ to fall to zero.

Step 1706: The logic controller 312 controls the driving circuit 608 to be turned off to stop controlling the output voltage $V_{out}$ to fall in the specific ratio with the falling curve of the reference voltage $V_{ref}$.

Step 1708: End.

Figure 18:
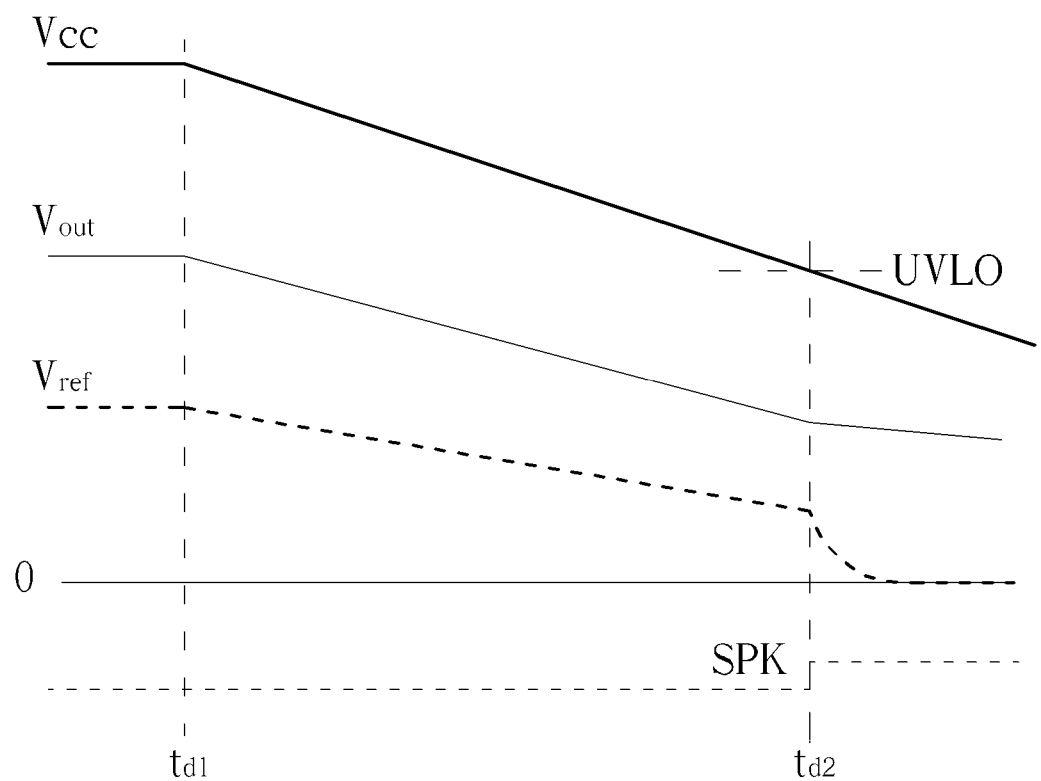
FIG. 18 is a schematic diagram of the voltage of the input power falling slowly according to an embodiment of the present invention.

According to the slow power off process 170, when the logic controller 312 detects that the voltage of the input power $V_{CC}$ is falling slowly and that its falling speed is less than the falling speed of the reference voltage $V_{ref}$ (i.e. at time $t_{d1}$), since the reference voltage $V_{ref}$ is equal to a fixed ratio of the voltage of the input power $V_{CC}$, the reference voltage $V_{ref}$ may also fall slowly with the voltage of the input power $V_{CC}$, which causes the output voltage $V_{out}$ to also fall with the reference voltage $V_{ref}$ and the voltage of the input power $V_{CC}$. This is shown in FIG. 18, which is a schematic diagram of the voltage of the input power $V_{CC}$ falling slowly according to an embodiment of the present invention. When the voltage of the input power $V_{CC}$ falls below the threshold voltage $V_{th}$ (i.e. at time $t_{d2}$), the single-ended output class-D amplifier 30 enters the UVLO mode. At this moment, the reference voltage generator 304 controls the reference voltage $V_{ref}$ to fall to zero, to wait until a next time when the power supply 310 is turned on and charged again. The logic controller 312 controls the driving circuit 608 to be turned off through the driving circuit shutdown signal $SD_{DRV}$. At this moment, the output terminal enters the high impedance status, and hence the output voltage $V_{out}$ may fall with an extremely slow speed. At time $t_{d2}$, when the falling speed of the output voltage $V_{out}$ varies, a tiny pop may be generated at the electric-to-audio converting device SPK. Since the falling speed of the output voltage $V_{out}$ is extremely slow, the tiny pop cannot be heard.

Please note that the spirit of the present invention is to reduce a pop in a single-ended output class-D amplifier. Those skilled in the art can make modifications or alterations accordingly. The operation of the reference voltage and the output voltage rising/falling with an S-shaped curve, power supply detection, output voltage detection, the base select function, the inside feedback path, etc . for controlling the output voltage when the power supply is turned on/off and the shutdown signal SD is activated/released to prevent the output voltage from rising and falling rapidly so as to reduce a pop, are detailed in the claims of the present invention. For example, the low-pass filter 314 may be implemented with the inductor L4 and the capacitor C4, but in other embodiments, a low-pass filter may also be implemented with a resistor and a capacitor. Those skilled in the art can determine which type of low-pass filter should be utilized according to system requirements. In addition, the variable resistors R1 and R2 are utilized in the gain-adjustable stage 306 for adjusting the gain of the single-ended output class-D amplifier 30 by means of adjusting their resistances. The gain-adjusted function can also be realized by utilizing other quantities of variable resistors. For example, only one variable resistor may be utilized, and the input terminal of the operational amplifier 502 may be coupled to different nodes in the variable resistor to adjust the gain of the single-ended output class-D amplifier 30. If the gain of the single-ended output class-D amplifier can be fixed, the fixed resistors can also be utilized for implementing the single-ended output class-D amplifier.

In the prior art, the method for solving the pop issue is to utilize more resistors and capacitors in the reference voltage generator, or any method which increases the time constant to extend a bias setup time for the output voltage, which prevent the pop from being generated. When the bias of the output voltage is required to be set up in a shorter time (e.g. when the power supply is turned on/off or the shutdown signal is activated/released) , however, the pop noise may occur. In comparison, the present invention can utilize methods such as the reference voltage and the output voltage rising/falling with an S-shaped curve, power supply detection, output voltage detection, the base select function, and the inside feedback path, etc. to control the output voltage when the power supply is turned on/off and the shutdown signal is activated/released to prevent the output voltage from rising and falling rapidly. In this way, the likelihood of a popping noise being generated is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pop-free single-ended output class-D amplifier, comprising:
   an input signal generator, for generating an input signal;
   a power supply, for supplying input power;
   a reference voltage generator, for generating a reference voltage;
   a gain-adjustable stage, coupled to the reference voltage generator and the input signal generator, for generating an amplified signal according to the reference voltage and adjusting a gain of the single-ended output class-D amplifier;
   a pulse width modulation (PWM) module, coupled to the reference voltage generator, the gain-adjustable stage, and the power supply, for outputting a pulse width modulation signal according to the reference voltage, the amplified signal, and the input power;
   a low-pass filter, coupled to the pulse width modulation module, for low-pass filtering the pulse width modulation signal to generate an output voltage; and
   a logic controller, coupled to the power supply, the reference voltage generator, the gain-adjustable stage, and the pulse width modulation module, for generating at least one control signal to control the reference voltage generator, the gain-adjustable stage, and the pulse width modulation module according to the input power, the reference voltage, and the pulse width modulation signal.

2. The single-ended output class-D amplifier of claim 1, further comprising:
   a coupling capacitor, coupled to the low-pass filter, for retrieving an alternating current (AC) component of the output voltage; and
   an electric-to-audio converting device, coupled to the coupling capacitor, for outputting audio signals to generate sound.

3. The single-ended output class-D amplifier of claim 1, wherein the reference voltage generator controls the reference voltage to rise and fall with an S-shaped curve.

4. The single-ended output class-D amplifier of claim 1, wherein the gain-adjustable stage comprises:
   at least one variable resistor, for adjusting the gain of the single-ended output class-D amplifier;
   an operational amplifier, for outputting the amplified signal according to the input signal and the reference voltage, the operational amplifier comprising:
      a first input terminal, coupled to the variable resistor;
      a second input terminal, coupled to the reference voltage generator; and
      an output terminal, for outputting the amplified signal;
   a mute switch, coupled to the variable resistor, the operational amplifier, and the logic controller, for controlling the gain of the single-ended output class-D amplifier; and
   a fast charging circuit, coupled to the input signal generator and the output terminal of the operational amplifier, for charging the input signal according to the reference voltage.

5. The single-ended output class-D amplifier of claim 4, wherein when the logic controller controls the mute switch to be turned on, the mute switch controls the gain of the single-ended output class-D amplifier to be zero.

6. The single-ended output class-D amplifier of claim 1, wherein the pulse width modulation module comprises:
   at least one resistor, for providing a feedback path, determining loop gain of the pulse width modulation module, and setting a specific ratio of the output voltage and the reference voltage;
   an error amplifier, coupled to the resistor and the reference voltage generator, for determining a target voltage for the reference voltage;
   a ramp generator, for generating a ramp signal, wherein frequency of the ramp signal determines frequency of the pulse width modulation signal;
   a first comparator, coupled to the ramp generator and the error amplifier, for generating the pulse width modulation signal; and
   a driving circuit, coupled to the first comparator, for outputting the pulse width modulation signal and providing a base select function.

7. The single-ended output class-D amplifier of claim 6, wherein when a voltage of the input power is less than the output voltage, the logic controller controls the driving circuit to activate the base select function to prevent a current from flowing from an output terminal of the driving circuit to the power supply, which causes the output voltage to fall with the voltage of the input power.

8. The single-ended output class-D amplifier of claim 7, wherein when a high-side transistor of the driving circuit is a p-type metal oxide semiconductor (PMOS) transistor, the logic controller controls the driving circuit to make a base of the p-type metal oxide semiconductor transistor coupled to the output terminal of the driving circuit.

9. The single-ended output class-D amplifier of claim 7, wherein when a high-side transistor of the driving circuit is an n-type metal oxide semiconductor (NMOS) transistor, the logic controller controls the driving circuit to make a base of the n-type metal oxide semiconductor transistor coupled to the power supply.

10. The single-ended output class-D amplifier of claim 1, wherein the pulse width modulation module comprises an inside feedback path, for preventing a spike from being generated at the output voltage when a loop in the pulse width modulation module is unstable, so as to prevent a pop from being generated.

11. The single-ended output class-D amplifier of claim 1, wherein the logic controller comprises a comparator, for determining whether the reference voltage is greater than a specific ratio of the output voltage.

12. The single-ended output class-D amplifier of claim 1, wherein the logic controller comprises a comparator, for determining whether a voltage of the input power is less than the output voltage.

13. The single-ended output class-D amplifier of claim 1, wherein frequency of the pulse width modulation signal is greater than an audio frequency which can be heard by human ears.

14. A pop-free controlling method for a single-ended output class-D amplifier, for reducing a pop when the single-ended output class-D amplifier detects an input power is starting to be supplied or a shutdown signal is released, the pop-free controlling method comprising:
   turning on a mute switch to control a gain of the single-ended output class-D amplifier to be zero;
   resetting a reference voltage and then controlling the reference voltage to rise;
   turning on a fast charging circuit to charge an input signal according to the reference voltage;
   turning off a driving circuit in a pulse width modulation (PWM) module; and turning on an inside feedback path in the pulse width modulation module to prevent a spike from being generated at an output voltage when a loop of the pulse width modulation module is unstable, so as to prevent a pop from being generated.

15. The pop-free controlling method of claim 14, wherein controlling the reference voltage to rise comprises controlling the reference voltage to rise with an S-shaped curve.

16. The pop-free controlling method of claim 14, wherein when the reference voltage rises to a voltage level greater than a specific ratio of the output voltage, the following steps are executed:
turning on the driving circuit in the pulse width modulation module to control the output voltage to rise in the specific ratio with a rising curve of the reference voltage; and
turning off the inside feedback path of the pulse width modulation module.

17. The pop-free controlling method of claim 16, wherein the step of controlling the output voltage to rise in the specific ratio with the rising curve of the reference voltage comprises:
generating a pulse width modulation signal according to the reference voltage, wherein a duty cycle of the pulse width modulation signal corresponds to magnitude of the reference voltage; and
multiplying the duty cycle of the pulse width modulation signal by magnitude of a voltage of the input power to generate the output voltage.

18. The pop-free controlling method of claim 14, wherein when the reference voltage rises to a target voltage, the following steps are executed:
controlling the reference voltage to remain at the target voltage;
turning off the mute switch and the fast charging circuit; and
starting to output the output voltage according to the input signal.

19. The pop-free controlling method of claim 18, wherein the step of outputting the output voltage according to the input signal comprises:
amplifying the input signal;
generating a pulse width modulation signal according to the amplified input signal, wherein a duty cycle of the pulse width modulation signal corresponds to magnitude of a voltage of the input signal; and
multiplying the duty cycle of the pulse width modulation signal by magnitude of a voltage of the input power to generate the output voltage.

20. A pop-free controlling method for a single-ended output class-D amplifier, for reducing a pop when detecting a shutdown signal is activated, the pop-free controlling method comprising:
turning on a mute switch to control a gain of the single-ended output class-D amplifier to be zero; and
controlling a reference voltage to fall, such that an output voltage falls in a specific ratio with a falling curve of the reference voltage.

21. The pop-free controlling method of claim 20, wherein controlling the reference voltage to fall comprises controlling the reference voltage to fall with an S-shaped curve.

22. The pop-free controlling method of claim 20, wherein the step of the output voltage falling in the specific ratio with the falling curve of the reference voltage comprises:
generating a pulse width modulation signal according to the reference voltage, wherein a duty cycle of the pulse width modulation signal corresponds to magnitude of the reference voltage; and
multiplying the duty cycle of the pulse width modulation signal by magnitude of a voltage of an input power to generate the output voltage.

23. The pop-free controlling method of claim 20, wherein when the reference voltage falls to zero, the reference voltage stops falling.

24. A pop-free controlling method for a single-ended output class-D amplifier, for reducing a pop when detecting a voltage of an input power is falling rapidly, the pop-free controlling method comprising:
turning on a mute switch to control a gain of the single-ended output class-D amplifier to be zero; and
controlling a reference voltage to fall, such that an output voltage falls in a specific ratio with a falling curve of the reference voltage.

25. The pop-free controlling method of claim 24, wherein controlling the reference voltage to fall comprises controlling the reference voltage to fall with an S-shaped curve.

26. The pop-free controlling method of claim 24, wherein the step of the output voltage falling in the specific ratio with the falling curve of the reference voltage comprises:
generating a pulse width modulation signal according to the reference voltage, wherein a duty cycle of the pulse width modulation signal corresponds to magnitude of the reference voltage; and
multiplying the duty cycle of the pulse width modulation signal by magnitude of the voltage of the input power to generate the output voltage.

27. The pop-free controlling method of claim 24, wherein when the voltage of the input power falls below the output voltage, a base select function is activated for preventing a current from flowing from an output terminal of a driving circuit to a power supply which supplies the input power, which causes the output voltage to fall with the voltage of the input power.

28. The pop-free controlling method of claim 27, wherein when a high-side transistor of the driving circuit is a p-type metal oxide semiconductor transistor (PMOS), a base of the p-type metal oxide semiconductor transistor is coupled to the output terminal of the driving circuit.

29. The pop-free controlling method of claim 27, wherein when a high-side transistor of the driving circuit is an n-type metal oxide semiconductor transistor (NMOS), a base of the n-type metal oxide semiconductor transistor is coupled to the power supply.

30. The pop-free controlling method of claim 24, wherein when the voltage of the input power falls below a predefined value, the following steps are executed:
controlling the reference voltage to fall to zero; and
stopping controlling the output voltage to fall in the specific ratio with the falling curve of the reference voltage.

31. A pop-free controlling method for a single-ended output class-D amplifier, for reducing a pop when detecting a voltage of an input power is falling slowly and below a predefined value, the pop-free controlling method comprising:
controlling a reference voltage to fall to zero; and
stopping controlling an output voltage to fall in a specific ratio with a falling curve of the reference voltage.

* * * * *